(12) United States Patent
Ren et al.

US011447882B2

(10) Patent No.: US 11,447,882 B2
(45) Date of Patent: Sep. 20, 2022

(54) METHODS FOR MAKING BIFUNCTIONAL POROUS NON-NOBLE METAL PHOSPHIDE CATALYST FOR OVERALL WATER SPLITTING, ELECTRODES FOR OVERALL WATER SPLITTING, AND METHODS FOR ELECTROCATALYTIC WATER SPLITTING

(71) Applicant: University of Houston System, Houston, TX (US)

(72) Inventors: Zhifeng Ren, Pearland, TX (US); Fang Yu, Houston, TX (US); Haiqing Zhou, Houston, TX (US); Shuo Chen, Houston, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 1 day.

(21) Appl. No.: 17/047,032

(22) PCT Filed: Apr. 10, 2019

(86) PCT No.: PCT/US2019/026814
§ 371 (c)(1),
(2) Date: Oct. 12, 2020

(87) PCT Pub. No.: WO2020/033018
PCT Pub. Date: Feb. 13, 2020

(65) Prior Publication Data
US 2021/0189574 A1    Jun. 24, 2021

Related U.S. Application Data

(60) Provisional application No. 62/656,562, filed on Apr. 12, 2018.

(51) Int. Cl.
| | | |
|---|---|---|
| *C23C 16/30* | (2006.01) | |
| *C25B 11/075* | (2021.01) | |
| *C25B 11/061* | (2021.01) | |
| *C25B 1/04* | (2021.01) | |
| *C23C 16/04* | (2006.01) | |
| *C23C 16/18* | (2006.01) | |

(52) U.S. Cl.
CPC .......... *C25B 11/075* (2021.01); *C23C 16/045* (2013.01); *C23C 16/18* (2013.01); *C23C 16/30* (2013.01); *C25B 1/04* (2013.01); *C25B 11/061* (2021.01)

(58) Field of Classification Search
CPC ........ C23C 16/045; C23C 16/18; C23C 16/30
See application file for complete search history.

(56) References Cited

U.S. PATENT DOCUMENTS

| | | | | |
|---|---|---|---|---|
| 9,954,231 B2* | 4/2018 | Kim | .................... | H01M 4/8828 |
| 11,271,193 B2* | 3/2022 | Ren | ....................... | C25B 11/031 |
| 2010/0221424 A1* | 9/2010 | Malecki | ................ | C01B 32/164 |
| | | | | 118/724 |
| 2013/0216923 A1* | 8/2013 | Hosseiny et al. | ........ | C25D 3/56 |
| 2016/0289849 A1* | 10/2016 | Cui | ........................ | C25B 11/051 |
| 2016/0289852 A1* | 10/2016 | Cui | ..................... | H01M 4/8878 |
| 2017/0015558 A1 | 1/2017 | Zhang et al. | | |
| 2017/0207464 A1* | 7/2017 | Gyenge | .................. | C25D 13/12 |
| 2018/0023199 A1* | 1/2018 | Sun | ......................... | H01M 4/58 |
| | | | | 429/94 |
| 2018/0080136 A1 | 3/2018 | Li et al. | | |
| 2018/0093893 A1* | 4/2018 | Dai | ......................... | C01B 32/15 |
| 2018/0190996 A1* | 10/2018 | Wang | ...................... | C08L 79/08 |
| 2018/0305827 A1* | 10/2018 | Wang | ...................... | C08L 79/08 |
| 2021/0354120 A1* | 11/2021 | Yang | ....................... | C25D 11/02 |
| 2021/0404073 A1* | 12/2021 | Kanatzidis | ............. | C25B 11/02 |

FOREIGN PATENT DOCUMENTS

| | | |
|---|---|---|
| WO | 2017/084874 A1 | 5/2017 |
| WO | 2017/09195 A1 | 6/2017 |
| WO | 2017/182923 A1 | 10/2017 |
| WO | 2020/033018 A1 | 2/2020 |

OTHER PUBLICATIONS

Zhang, Jintao, et al., "A metal-free bifunctional electrocatalyst for oxygen reduction and oxygen evolution reactions". Nature Nanotechnology, vol. 10, May 2015, pp. 444-452.*
Yang, Libin, et al., "An efficient bifunctional electrocatalyst for water splitting based on cobalt phosphide". Nanotechnology 27 (2016) 23LT01 pp. 1-7.*
Sun, Meng, et al., "Earth-Rich Transition Metal Phosphide for Energy Conversion and Storage". Advanced Energy Materials, 2016, 6, 1600087, pp. 1-34.*
Sasikala, N., et al., "Bifunctional electrocatalyst for oxygen/air electrodes". Energy Conversion and Management 77 (2014) 545-549.*
Zhang, Rong, et al., "Selective phosphidation: an effective strategy toward CoP/CeO2 interface engineering for superior alkaline hydrogen evolution electrocatalysis". Journal of Materials Chemistry A, 2018, 6, 1985-1990.*
Sun, Tingting, et al., "Single-atomic cobalt sites embedded in hierarchically ordered porous nitrogen-doped carbon as a superior bifunctional electrocatalyst". PNAS, vol. 15, No. 50, Dec. 11, 2018, pp. 12692-12697.*

(Continued)

*Primary Examiner* — Bret P Chen
(74) *Attorney, Agent, or Firm* — Conley Rose, P.C.

(57) ABSTRACT

A method of manufacturing a bifunctional electrocatalyst for overall water splitting comprising oxygen evolution reaction (OER) and hydrogen evolution reaction (HER) by growing electrocatalyst comprising primarily metallic phosphides on a three-dimensional substrate by: immersing the substrate in an iron nitrate solution to form a once disposed substrate; subjecting the once disposed substrate to thermal phosphidation with phosphorus powder under inert gas to grow metal phosphides thereupon and form a once subjected substrate; cooling the once subjected substrate to form a cooled, once subjected substrate; immersing the cooled, once subjected substrate in an iron nitrate solution to form a twice disposed substrate; and subjecting the twice disposed substrate to thermal phosphidation with phosphorus powder under inert gas to provide an electrode comprising the bifunctional electrocatalyst on the three-dimensional substrate.

13 Claims, 28 Drawing Sheets

(56) References Cited

OTHER PUBLICATIONS

Wang, Xiaoguang, et al., "Bifunctional Nickel Phosphide Nanocatalysts Supported on Carbon Fiber Paper for Highly Efficient and Stable Overall Water Splitting". Adv. Funct. Mater. 2016, 26, 4067-4077.*

Xu, Wence, et al., "A nanoporous metal phosphide catalyst for bifunctional water splitting". J. Mater. Chem. A, 2018, 6, 5574-5579.*

Yu, Fang, et al., "High-performance bifunctional porous non-noble metal phosphide catalyst for overall water splitting". Nature Communications (2018)9:2551, pp. 1-9.*

Zhang, Chi, et al., "Ternary nickel iron phosphide supported on nickel foam as a high-efficiency electrocatalyst for overall water splitting". International Journal of Hydrogen Energy 43 (2018) 7299-7306.*

PCT/US2019/026814 International Search Report and Written Opinion dated Mar. 5, 2020 (21 p.).

\* cited by examiner

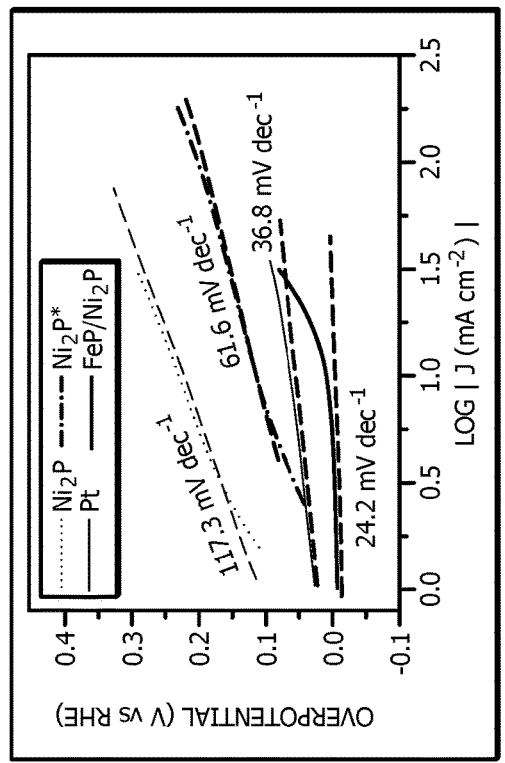
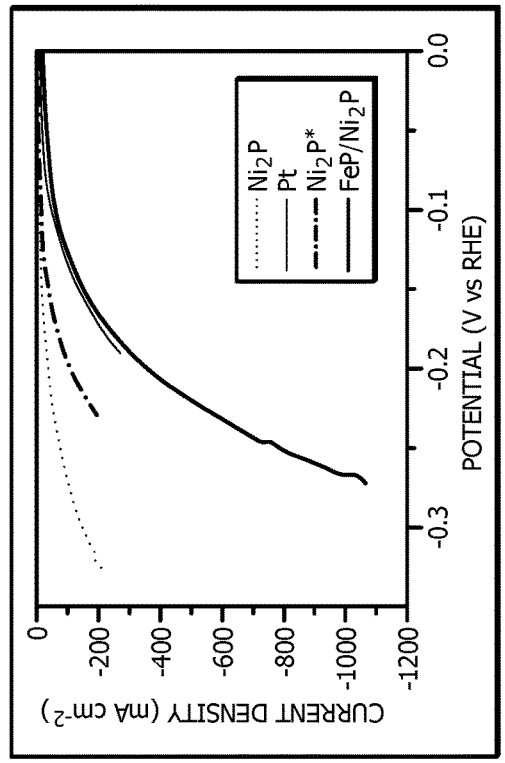
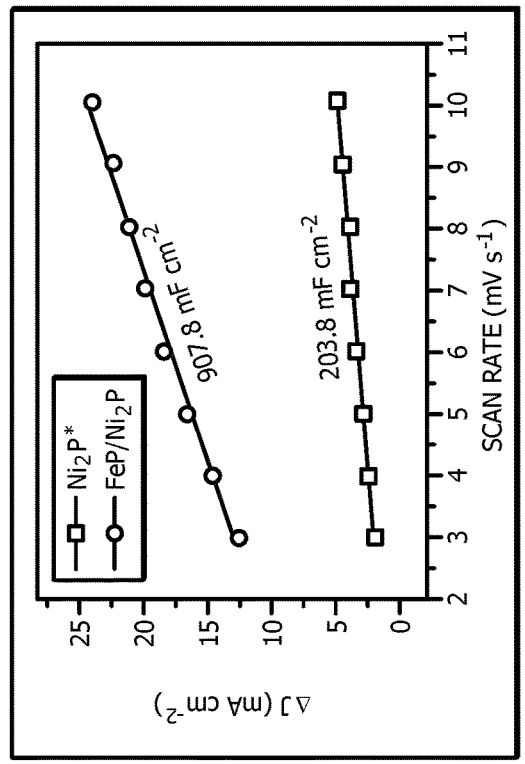
FIG. 9A
FIG. 9B
FIG. 9C

METHODS FOR MAKING BIFUNCTIONAL POROUS NON-NOBLE METAL PHOSPHIDE CATALYST FOR OVERALL WATER SPLITTING, ELECTRODES FOR OVERALL WATER SPLITTING, AND METHODS FOR ELECTROCATALYTIC WATER SPLITTING

CROSS-REFERENCE TO RELATED APPLICATIONS

This application is a 35 U.S.C. § 371 national stage application of PCT/US2019/026814 filed Apr. 10, 2019, and entitled "High Performance Bifunctional Porous Non-Noble Metal Phosphide Catalyst for Overall Water Splitting," which claims priority to U.S. Patent Application No. 62/656,562, entitled "High Performance Bifunctional Porous Non-Noble Metal Phosphide Catalyst for Overall Water Splitting," filed Apr. 12, 2018, the disclosures of which are incorporated herein by reference in their entirety for all purposes.

STATEMENT REGARDING FEDERALLY SPONSORED RESEARCH OR DEVELOPMENT

This research was sponsored in part by the US Department of Energy under Contract No. DE-SC0010831.

TECHNICAL FIELD

The present disclosure relates to water splitting; more particularly, the present disclosure provides bifunctional electrocatalysts for overall water splitting including hydrogen evolution reaction (HER) and oxygen evolution reaction (OER); still more particularly, the present disclosure provides a high performance, bifunctional, porous, non-noble metal phosphide catalyst for overall water splitting.

BACKGROUND

The scalable storage of such abundant renewable energy sources as wind or solar energy is sought to mitigate the aggravated global energy crisis while addressing the environmental issues. Converting solar- or wind-derived electricity to hydrogen fuel via water electrolysis (or 'water splitting') is an appealing means to accomplish this energy conversion and storage technology. Water splitting is a term that refers to the chemical reaction where water is separated into its elements of hydrogen and oxygen. This may be employed in order to obtain hydrogen for various applications, including hydrogen fuel production. Hydrogen ($H_2$) production from electrochemical water splitting is a clean and sustainable energy resource that may be used to substitute fossil fuels and meet rising global energy demand, since water is the only starting source and byproduct during fuel burning in an engine.

There are two commercialized water electrolysis avenues, including alkaline and proton exchange membrane (PEM) water electrolysis. PEM water electrolysis has high energy efficiency with high hydrogen production rate, but requires noble metal (platinum (Pt) and iridium (Ir))-based catalysts, making it unfavorable due to high cost and scarcity. The alternative, low-cost alkaline water electrolysis, is a mature technology for large-scale hydrogen production that is low-cost due to compatibility with non-noble catalysts, but it suffers from low production rates. A challenge remains due to the huge energy penalty incurred by the uphill reaction kinetics of the catalysts that require significantly high cell voltages (1.8-2.4 V, far larger than the thermodynamic value of 1.23 V) to catalyze the reaction with electrolysis currents of 200-400 mA/cm$^2$, resulting in the production of less than 5% hydrogen by means of water electrolysis in the worldwide industry.

Existing bifunctional catalysts to negotiate the overall water splitting efficiently in alkaline electrolytes can operate only steadily at low current density (e.g., less than 20 mA/cm$^2$), not to mention the low energy conversion efficiency at above 200 mA/cm$^2$ required for commercial applications. These catalysts are inadequate for industrial scale use, due to a difficulty in integrating both the merits of hydrogen evolution reaction (HER) and oxygen evolution reaction (OER) electrocatalysts in a single bifunctional catalyst in the same electrolyte (either alkaline or acid).

Accordingly, known bifunctional electrocatalysts fabricated for alkaline water electrolysis do not simultaneously exhibit good performance for both the HER and OER, especially the OER, and known bifunctional water electrolyzers do not provide high-current operation. Thus, there exists a need for a single bifunctional catalyst that provides outstanding HER and OER activities simultaneously in the same electrolyte. Desirably, such a bifunctional catalyst is a non-precious metal-based, robust bifunctional catalyst for promoting both cathodic hydrogen evolution and anodic oxygen evolution reactions, thus expediting overall water splitting toward large-scale commercialization at high current densities with low cell voltages.

SUMMARY

Herein disclosed is a method of manufacturing a bifunctional electrocatalyst for overall water splitting comprising oxygen evolution reaction (OER) and hydrogen evolution reaction (HER), the method comprising: growing electrocatalyst comprising primarily metallic phosphides on a three-dimensional substrate by: immersing the substrate in an iron nitrate solution to form a once disposed substrate; subjecting the once disposed substrate to thermal phosphidation with phosphorus powder under inert gas to grow metal phosphides thereupon and form a once subjected substrate; cooling the once subjected substrate to form a cooled, once subjected substrate; immersing the cooled, once subjected substrate in an iron nitrate solution to form a twice disposed substrate; and subjecting the twice disposed substrate to thermal phosphidation with phosphorus powder under inert gas to provide an electrode comprising the bifunctional electrocatalyst on the three-dimensional substrate.

Also disclosed herein is an electrode for overall water splitting, the electrode comprising: a substrate; and a bifunctional electrocatalyst comprising primarily metallic phosphides on a surface of the substrate.

Also disclosed herein is a method of electrocatalytic water splitting, the method comprising: providing an anode and a cathode, wherein each of the anode and the cathode comprises a uniform distribution of a bifunctional electrocatalyst comprising metallic phosphides on a conductive substrate; and utilizing the anode and the cathode for alkaline water electrolysis, wherein the bifunctional electrocatalyst promotes hydrogen evolution reaction (HER) at the cathode, and oxygen evolution reaction (OER) at the anode.

BRIEF DESCRIPTION OF THE DRAWINGS

For a more complete understanding of the present disclosure and the advantages thereof, reference is now made to the following brief description, taken in connection with the accompanying drawings and detailed description, wherein like reference numerals represent like parts.

FIG. 3b provides an enlarged region of the curves in FIG. 3a;

FIG. 9a provides the HER polarization curves of different catalysts of Example 3;

FIG. 9b are Tafel plots for catalysts of FIG. 9a and Example 3;

FIG. 9c provides double-layer capacitance measurements for determining electrochemically active surface areas of $Ni_2P$ and FeP/$Ni_2P$ electrodes of Example 3;

FIG. 16b shows an enlarged version at low current density region of FIG. 16a;

FIG. 17 provides a cyclic voltammetry (CV) curve (raw data; dashed) and corresponding average activity (solid) calculated from the backward and forward CV curve of FeP/Ni$_2$P as a bifunctional catalyst for overall water splitting obtained at a scan rate of 1 mV s$^{-1}$ in Example 4a;

FIG. 18a shows GC signals for the FeP/Ni$_2$P-based water alkaline electrolyzer after 20 and 40 min of overall water splitting in Example 4a; and FIG. 18b shows the amounts of H$_2$ and O$_2$ gases versus time at a constant current density of 100 mA cm$^{-2}$ in Example 4a.

DETAILED DESCRIPTION

Figure 1B:
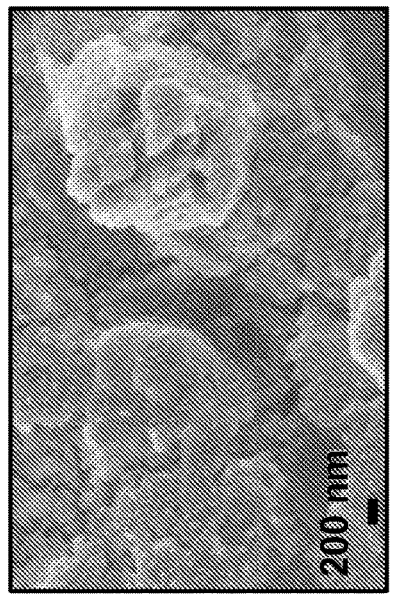
FIG. 1b provides high-magnification SEM images of FeP/$Ni_2P$ nanoparticles supported on 3D Ni foam of Example 1.

It should be understood at the outset that although an illustrative implementation of one or more exemplary embodiments is provided below, the disclosed compositions, methods, and/or products may be implemented using any number of techniques, whether currently known or in existence. The disclosure should in no way be limited to the illustrative implementations, drawings, and techniques illustrated hereinbelow, including the exemplary designs and implementations illustrated and described herein, but may be modified within the scope of the appended claims along with their full scope of equivalents.

The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ."

Overview

Discussed herein are methods of fabrication of an electrocatalyst derived from metallic phosphides (e.g., iron phosphide (FeP) and dinickel phosphide (Ni$_2$P) (also referred to herein at times simply as 'nickel phosphide') supported on a substrate (e.g., a conductive metal substrate such as commercial Ni foam), and the resulting electrocatalyst, which is competent for catalyzing the overall water splitting with outstanding catalytic performance. In embodiments, the herein-disclosed catalyst provides robust catalytic performance for both the OER and HER, and outstanding performance for overall water splitting in base with good durability not only at low current density, but also at high current density (e.g., above 500 mA cm$^{-2}$).

In embodiments, disclosed herein is a hybrid catalyst constructed by iron and dinickel phosphides on nickel foams that drives both hydrogen evolution reaction (HER) and oxygen evolution reaction (OER) well in base. In embodiments, the hybrid catalyst of this disclosure substantially expedites overall water splitting at 10 mA cm$^{-2}$ (e.g., with 1.42 V), and may outperform conventional, integrated IrO$_2$ and Pt couple (with 1.57 V). In embodiments, the herein-disclosed catalyst provides excellent stability at high current densities (e.g., greater than or equal to about 500-1500 mA cm$^{-2}$). For example, in embodiments, the herein-disclosed hybrid catalyst delivers 500 mA cm$^{-2}$ at low overpotential (e.g., less than or equal to about 1.72 V) with good durability (e.g., for at least 40 hours) without decay, providing great potential for large-scale applications.

Also disclosed herein is a method of hybridizing two metallic iron and dinickel phosphides (FeP/Ni$_2$P) on commercial nickel (Ni) foams to produce an extremely active bifunctional electrocatalyst for both OER and HER, that provides exceptional overall water splitting surpassing conventional commercial alkaline electrolyzers in 1 M KOH. In embodiments, an FeP/Ni$_2$P hybrid catalyst of this disclosure performs well for HER with catalytic performance (e.g., −14 mV to achieve −10 mA/cm$^2$) as good as that of the state-of-the-art noble Pt catalyst (−57 mV), and also for OER with a very low overpotential (e.g., 154 mV to afford 10 mA/cm$^2$), substantially outperforming the benchmark IrO$_2$ (281 mV) and other known robust OER catalysts. Due to the excellent HER and OER activity of the herein-disclosed bifunctional electrocatalyst, in embodiments, a bifunctional catalyst of this disclosure can be utilized directly as both the anode and cathode electrodes in an alkaline-electrolyzer. In such embodiments, a low cell voltage (e.g., 1.42 V) can deliver 10 mA/cm$^2$, and a low cell voltage (e.g., 1.72 V) can deliver 500 mA cm$^{-2}$ with 40 h durability. The herein-disclosed bifunctional electrocatalyst may thus surpass the performance of conventional industrial catalysts, which typically require 2.40 V for 400 mA/cm$^2$.

Method of Making Electrocatalyst/Electrode

As noted above, herein-disclosed is a method of manufacturing an electrode/electrocatalyst for hydrogen evolution reaction (HER) at the cathode and oxygen evolution reaction (OER) at the anode in overall water splitting. In embodiments, the catalyst is a three-dimensional Fe-mainly bifunctional electrocatalyst. In embodiments, the (e.g., iron-mainly) electrocatalyst is directly grown on Ni foam or other conductive scaffolds, such as, without limitation, carbon cloth paper, Cu foam, Co foam, Fe foam, Ti foam, or a combination thereof. The electrocatalyst may be grown, in embodiments, via a two-time thermal phosphidation in a tube furnace using iron-based aqueous solutions and P sources (e.g., iron nitrate and red phosphorus, respectively). Via the herein-disclosed method, a hybrid FeP/Ni$_2$P catalyst with high porosity on Ni foam surface can be prepared.

Herein-disclosed is a method of manufacturing a bifunctional electrocatalyst for overall water splitting comprising oxygen evolution reaction (OER) and hydrogen evolution reaction (HER). In embodiments, the method comprises growing electrocatalyst comprising primarily metallic phosphides on a three-dimensional substrate. The electrocatalyst comprising primarily metallic phosphides can be grown on the three-dimensional substrate by immersing the substrate in an iron nitrate solution to form a once disposed substrate; subjecting the once disposed substrate to (e.g., a first) thermal phosphidation with red phosphorus under inert gas to grow metal phosphides thereupon and form a once subjected substrate; and cooling the once subjected substrate to form a cooled, once subjected substrate comprising the bifunctional electrocatalyst comprising metallic phosphides disposed on the three-dimensional substrate. In embodiments, the method can comprise a two-time thermal phosphidation. In such embodiments, the method can further comprise immersing the cooled, once subjected substrate in an iron nitrate solution to form a twice disposed substrate; and subjecting the twice disposed substrate to (e.g., a second) thermal phosphidation with red phosphorus under inert gas to provide an electrode comprising the bifunctional electrocatalyst on the three-dimensional substrate. Accordingly, in embodiments, a method of manufacturing a bifunctional electrocatalyst for overall water splitting comprising oxygen evolution reaction (OER) and hydrogen evolution reaction (HER) comprises growing electrocatalyst comprising primarily metallic phosphides on a three-dimensional substrate by immersing the substrate in an iron nitrate solution to form a once disposed substrate, subjecting the once disposed substrate to thermal phosphidation with phosphorus under inert gas to grow metal phosphides thereupon and form a once subjected substrate, cooling the once subjected substrate to form a cooled, once subjected substrate, immersing the cooled, once subjected substrate in an iron nitrate solution to form a twice disposed substrate, and subjecting the twice disposed substrate to thermal phosphidation with phosphorus under inert gas to provide an electrode comprising the bifunctional electrocatalyst on the three-dimensional substrate.

In embodiments, the three-dimensional substrate can comprise any suitable conductive scaffold. The three-dimensional substrate can comprise a conductive foam. In embodiments, the substrate comprises a metal foam. In embodiments, the three-dimensional substrate comprises one or more of a metallic foam or a carbon cloth paper. In embodiments, the metallic foam comprises nickel (Ni) foam, copper (Cu) foam, iron (Fe) foam, cobalt (Co) foam, titanium (Ti) foam, or a combination thereof. For example, in embodiments, the substrate comprises nickel (Ni) foam. The foam of the substrate, in embodiments, can have any suitable thickness. For example, in embodiments, the foam has a thickness in the range of from about 1 mm to about 2 mm. In embodiments, the foam may have a purity of at least 99.8%. In embodiments, the foam comprises a nickel foam. In embodiments, the nickel foam can have a surface density in the range of from about 280 $g/m^2$ to about 340 $g/m^2$. In embodiments, the nickel foam can have a porosity of greater than or equal to about 95, 96, or 97%, or in the range of from about 95 to about 97%, and may comprise from about 80 to about 110 pores per inch, and/or average pore diameters in the range of from about 0.2 to about 0.6 mm.

The iron nitrate solution can be selected from iron(III) nitrate ($Fe(NO_3)_3$), iron(II)nitrate ($Fe(NO_3)_2$), or a combination thereof. In embodiments, the iron nitrate solution comprises iron(III) nitrate nonahydrate [$Fe(NO_3)_3 \cdot 9H_2O$], iron(III)nitrate ($Fe(NO_3)_3$), or a combination thereof. Alternatively or additionally, iron oxide or (oxy)hydroxide nanostructures including nanoparticles, nanosheet or nanowire arrays may be, in embodiments, pre-loaded on the surface of conductive supports (e.g., Ni foam, Cu foam, etc.) by electrodeposition or physical dipping.

In embodiments, the electrode comprises a nickel (Ni) foam with dinickel phosphide ($Ni_2P$) and iron phosphide (FeP) formed on the surface of the nickel foam substrate. In such embodiments, therefore, the electrode can comprise a three-dimensional, porous $FeP/Ni_2P/Ni$ foam.

In embodiments the thermal phosphidation (e.g., the first thermal phosphidation, the second thermal phosphidation, or both) is effected at a temperature in the range of from about 300° C. to about 550° C., from about 400° C. to about 550° C., from about 400° C. to about 450° C., or from about 300° C. to about 350° C. In embodiments, the thermal phosphidation (e.g., the first thermal phosphidation, the second thermal phosphidation, or both) is effected at a temperature of less than or equal to about 400° C., 425° C., or 450° C. In embodiments, thermal phosphidation (e.g., the first thermal phosphidation, the second thermal phosphidation, or both) is effected in a total time of less than or equal to about 1.5 hours, 1.25 hours, or 1 hour. In embodiments, subjecting the once disposed substrate to thermal phosphidation, subjecting the twice disposed substrate to thermal phosphidation, or both comprises a thermal phosphidation for a duration of time in the range of from about 1 hour to about 4 hours, from about 1 hour to about 2 hours, or from about 2 hours to about 4 hours. Subjecting to thermal phosphidation can comprise direct thermal phosphidation via any means known in the art, for example, in a tube furnace or a chemical vapor deposition (CVD) system or molecular organic chemical vapor deposition (MOCVD) system under inert gas (e.g., under argon atmosphere).

The inert gas under which thermal phosphidation and/or cooling is effected can comprise argon (e.g., substantially pure argon), in embodiments. The phosphorus utilized during thermal phosphidation can comprise phosphorus powder, for example, red phosphorus, or $PH_3$ gas from sodium hypophosphite ($NaH_2PO_2$) with a very slow heating rate for phosphidation, or a combination thereof. During the first or second thermal phosphidation, red phosphorus powder can be used as the phosphorus source with a controlled temperature for heating, in which no water gas may be generated during phosphorus vapor going out. Thereby, phosphorus vapor can convert the iron precursors or metallic nickel to metal phosphides, rather than metal metaphosphate.

In embodiments, the metallic phosphides comprise primarily a combination of iron phosphide and dinickel phosphide. In embodiments, of the primarily iron and dinickel phosphides, the metallic phosphides comprise a majority of iron phosphide (FeP) and a minority of nickel phosphide ($Ni_2P$). 'Primarily' iron and dinickel phosphides indicates that, of the total metallic phosphides, more than at least 50 weight percent comprises iron and dinickel phosphides. In embodiments, greater than or equal to about 50, 60, 70, 80, or 90 weight percent of the total metallic phosphides comprise iron and dinickel phosphides. The 'majority' of iron phosphide (FeP) means that, based on the total iron and dinickel phosphides, greater than 50 weight percent comprises iron phosphide. In embodiments, greater than or equal to 50, 60, 70, 80, 85, 86, or 87 weight percent of the iron and dinickel phosphides comprise iron phosphide. The 'minority' of dinickel phosphide ($Ni_2P$) means that, based on the total iron and dinickel phosphides, less than 50 weight percent comprises dinickel phosphide. In embodiments, less than or equal to 20, 15, or 12.5 weight percent of the iron and dinickel phosphides comprise dinickel phosphide. In embodiments, the metallic phosphides comprise less than or equal to about 20, 15, 14, 13, or 12.5% weight percent dinickel phosphide ($Ni_2P$) and greater than or equal to about 80, 81, 82, 83, 84, 85, 86, 87, or 87.5% weight percent iron phosphide (FeP). In embodiments, the three-dimensional substrate comprises nickel (Ni) foam, the metal phosphides of the bifunctional electrocatalyst comprise or consist essentially of FeP and $Ni_2P$, and the electrode comprises or consists essentially of an $FeP/Ni_2P/Ni$ foam.

In embodiments, the method can further comprise drying. The drying can be performed subsequent disposing the three-dimensional substrate in the metal nitrate solution. In embodiments, drying comprises drying in ambient air.

Cooling can comprise cooling under inert gas, such as argon atmosphere. If a second thermal phosphidation step is performed, the steps of immersing the cooled, once subjected substrate in an iron nitrate solution to form a twice disposed substrate, and subjecting the twice disposed substrate to thermal phosphidation may be performed as described herein, and may be performed in substantially the same or a different manner from the steps followed the first time for immersing the substrate in the iron nitrate solution to form the once disposed substrate, subjecting the once disposed substrate to thermal phosphidation with phosphorus under inert gas to grow metal phosphides thereupon and form the once subjected substrate. For example, during the repeating of the step(s), the metal nitrate solution may be the same or different, drying may be utilized or omitted following immersing the substrate, the thermal phosphidation may be effected for a longer or shorter time period, at a higher or lower temperature, with a same or different phosphorus source or inert gas, etc. A second cooling step may follow the second thermal phosphidation step, in embodiments.

Herein-Disclosed Electrocatalyst/Electrode

Also disclosed herein is a bifunctional electrocatalyst and electrode produced as described hereinabove. In embodiments, the bifunctional electrocatalyst has a high porosity. In embodiments, the electrocatalyst is operable for alkaline water electrolysis. In embodiments, the bifunctional electrocatalyst exhibits good performance for both the HER and the OER, and is stable at current densities of up to at least 100 mA/cm$^2$, 300 mA/cm$^2$, or 500 mA/cm$^2$.

As noted hereinabove, in embodiments, the metallic phosphides of the bifunctional catalyst formed on the substrate can comprise iron phosphide (FeP) and dinickel phosphide (Ni$_2$P), or a combination thereof. In embodiments, a catalyst loading of the metallic phosphides on the substrate can be in the range of from about 8 to about 15 mg/cm$^2$.

Also disclosed herein is an electrode for overall water splitting, the electrode comprising: a substrate; and a bifunctional electrocatalyst comprising primarily metallic phosphides on a surface of the substrate. As noted above, the substrate of the herein-disclosed electrode can comprise a three dimensional substrate, such as, without limitation, a metal foam or carbon cloth paper. The metal foam can comprise nickel (Ni) foam, copper (Cu) foam, iron (Fe) foam, cobalt (Co) foam, titanium (Ti) foam, or a combination thereof, in embodiments. In embodiments, the metal foam comprises nickel (Ni) foam.

In embodiments, the metallic phosphides of the herein-disclosed electrode comprise primarily iron phosphide (FeP) and nickel phosphide (Ni$_2$P). In embodiments, the metallic phosphides comprise a very small fraction of nickel phosphide (Ni$_2$P) and a majority of iron phosphide (FeP). In embodiments, a loading of the bifunctional electrocatalyst comprising primarily metallic phosphides on the substrate of the herein-disclosed electrode is in the range of from about 8 to about 15 mg/cm$^2$. In embodiments, a loading of dinickel phosphide (Ni$_2$P) on the substrate of the herein-disclosed electrode is in the range of from about 1 to about 2 mg/cm$^2$, or less than or equal to about 2, 1.5, or 1 mg/cm$^2$. In embodiments, a loading of iron phosphide (FeP) on the substrate of the herein-disclosed electrode is in the range of from about 7 to about 13 mg/cm$^2$, or greater than or equal to about 7, 8, 9, 10, 11, 12, or 13 mg/cm$^2$.

In embodiments, the three dimensional substrate comprises nickel (Ni) foam, the metallic phosphides comprise primarily nickel phosphide (Ni$_2$P) and iron phosphide (FeP), and the herein-disclosed electrode thus comprises or consists essentially of FeP and Ni$_2$P on Ni foam.

In embodiments, the bifunctional electrocatalyst of the herein-disclosed electrode has a high porosity, which may, in embodiments, include a porosity of greater than or equal to a porosity of the three-dimensional substrate.

In embodiments, when operated in 1M alkaline solution, the bifunctional electrocatalyst/electrode of this disclosure requires a low overpotential of less than 15 mV and 155 mV, respectively, to deliver a current density of 10 mA/cm$^2$ for the HER and OER, and/or may be operable to provide to an overall water-splitting activity at 10 mA/cm$^2$ with less than 1.45 V.

In embodiments, when operated in 1M alkaline solution, the bifunctional electrocatalyst/electrode of this disclosure yields a current density of at least 100 mA/cm$^2$ at an overpotential of less than or equal to about 225 mV for the OER, exhibits durability for at least 5,000 cycles, is operable for at least 40 hours at 100 mA/cm$^2$, or a combination thereof.

Herein-Disclosed Method of Electrocatalytic Water Splitting

Also disclosed herein is a method of electrocatalytic water splitting, the method comprising: providing or forming an anode and a cathode, wherein at least one or both of the anode and the cathode comprise a uniform distribution of a bifunctional electrocatalyst of this disclosure (e.g., comprising metallic phosphides) on a conductive substrate; and utilizing the anode and the cathode for alkaline water electrolysis, wherein the bifunctional electrocatalyst promotes hydrogen evolution reaction (HER) at the cathode, and oxygen evolution reaction (OER) at the anode.

In embodiments, the bifunctional catalyst of the anode has the same composition as the bifunctional catalyst of the cathode. In embodiments, the metallic phosphides of the anode and/or the cathode comprise primarily iron phosphide (FeP) and nickel phosphide (Ni$_2$P). In embodiments, the metallic phosphides of the anode and/or the cathode comprise a majority of iron phosphide (FeP) and a minority of nickel phosphide (Ni$_2$P). In embodiments, a loading of the metallic phosphides on the conductive substrate of the anode and/or the cathode is in the range of from about 8 to about 15 mg/cm$^2$. In embodiments, a loading of dinickel phosphide (Ni$_2$P) on the conductive substrate of the anode and/or the cathode is in the range of from about 1 to about 2 mg/cm$^2$. In embodiments, a loading of dinickel phosphide (Ni$_2$P) on the conductive substrate of the anode and/or the cathode is less than or equal to about 2, 1.5, 1 mg/cm$^2$. In embodiments, a loading of iron phosphide (FeP) on the conductive substrate of the anode and/or the cathode is in the range of from about 7 to about 13 mg/cm$^2$. In embodiments, a loading of iron phosphide (FeP) on the conductive substrate of the anode and/or the cathode is greater than or equal to about 7, 8, 9, 10, 11, 12, or 13 mg/cm$^2$.

The conductive substrate of the anode and/or the cathode can comprise nickel foam, in embodiments. In embodiments, the anode and/or the cathode comprise an FeP/Ni$_2$P/Ni foam. In embodiments, when operated in 1M alkaline solution, the bifunctional electrocatalyst of the anode and/or the cathode requires a low overpotential of less than 15 mV and 155 mV, respectively, to deliver a current density of 10 mA/cm$^2$ for the HER and OER, leading to an overall water-splitting activity at 10 mA/cm$^2$ with less than 1.45 V.

In embodiments, the bifunctional electrocatalyst of the anode and/or the cathode has a high porosity, as evidenced, in embodiments, by a porosity of the bifunctional electrocatalyst on the conductive substrate of the anode and/or the cathode, respectively, that is greater than that of the conductive support.

Performance. In embodiments, the strong synergistic effects between the phosphides (e.g., between FeP and its support $Ni_2P$), good electrical conductivity of the substrate (e.g., Ni foam) and the metal phosphides, and high porosity of a herein-disclosed bifunctional (e.g., FeP/$Ni_2P$) electrocatalyst contribute greatly to the outstanding HER and OER activities of the final (e.g., FeP/$Ni_2P$) catalyst. For example, in embodiments, a herein-disclosed FeP/$Ni_2P$ catalyst requires relatively low overpotentials of 14 mV and 154 mV to deliver a current density of 10 mA $cm^{-2}$ for the HER and OER in base, respectively, leading to robust overall-water-splitting activity at 10 mA $cm^{-2}$ with 1.42 V. This activity outperforms the conventional integrated $IrO_2$ and Pt couple (1.57 V), demonstrating that Fe compounds are promising materials for water splitting, especially for catalyzing the OER process. In embodiments, the herein-disclosed bifunctional electrocatalysts can provide exhibit excellent durability without decay operated at high current densities above 500 mA $cm^{-2}$, providing great potential for large-scale applications.

Features and Potential Advantages

Herein disclosed is a rational design of a high performance bifunctional catalyst for overall water splitting. In embodiments, the catalyst is a porous, bifunctional FeP/$Ni_2P$ electrocatalyst. In embodiments, herein-disclosed is an FeP/$Ni_2P$ hybrid catalyst supported on 3D Ni foam that proves to be an outstanding bifunctional catalyst for overall water splitting, exhibiting both extremely high OER and HER activities in the same alkaline electrolyte. In embodiments, the herein-disclosed FeP/$Ni_2P$ hybrid catalyst supported on 3D Ni foam sets a new record in alkaline water electrolyzers (e.g., 1.42 V to afford 10 mA/$cm^2$), while at the commercially practical current density of 500 mA/$cm^2$ demanding a voltage of only 1.72 V, lower than those for any previously reported bifunctional catalysts, and maintains excellent catalytic activity for more than 40 hours at a current density of 500 mA/$cm^2$, paving the way for promising large-scale hydrogen generation.

Considering the low cost and earth abundance of the compounds utilized to produce the herein-disclosed catalyst, these catalysts may be promising alternatives to the noble catalysts for the OER, such as $IrO_2$ catalysts and Ni alloy-based electrocatalysts currently used in commercial alkaline water electrolysis. In particular, commercially purchased Ni foam as well as other conductive scaffolds can be supplied in large scale, so the as-prepared hybrid catalysts of this disclosure can be compatible, in embodiments, with sizable electrodes for potential applications in water electrolysis.

EXAMPLES

The embodiments having been generally described, the following examples are given as particular embodiments of the disclosure and to demonstrate the practice and advantages thereof. It is understood that the examples are given by way of illustration and are not intended to limit the specification or the claims in any manner.

Chemicals

Red phosphorous powder (Sigma Aldrich, ≥97%, CAS No. 7723-14-0), Iron(III) nitrate nonahydrate [Sigma Aldrich, $Fe(NO_3)_3 \cdot 9H_2O$, ≥99.95%, CAS No. 7782-61-8], Pt wire (CH Instruments, Inc.), Nafion 117 solution (5%; Sigma-Aldrich), iridium oxide powder (Alfa Aesar, $IrO_2$, 99%), potassium hydroxide (Alfa Aesar, KOH, 50% wt./vol.), and Ni foam (areal density 320 g/$cm^2$) were used without further purification.

Methods

Material synthesis. Metal phosphides ($Ni_2P$ and FeP) were grown by chemical vapor deposition in a tube furnace, in which Ni foam, $Fe(NO_3)_3$, and phosphorus were utilized as the Ni, Fe, and P sources, respectively. Namely, a commercially hydrophobic Ni foam was immersed into an aqueous $Fe(NO_3)_3$ solution, which was then converted to mainly FeP and a very small fraction of $Ni_2P$ at 450° C. in argon (Ar) atmosphere, with phosphorus powder supplied upstream. After that, the samples were naturally cooled down under Ar gas protection, which became hydrophilic after first phosphidation. In the following, a second-time phosphidation was performed after the samples were immersed into the $Fe(NO_3)_3$ solution again. For comparison, the as-prepared $Ni_2P$ samples were obtained in the same growth conditions without the addition of $Fe(NO_3)_3$, and the $Ni_2P^*$ samples were grown in the same experimental conditions by using $Ni(NO_3)_2$ instead of $Fe(NO_3)_3$. Thus, $Ni_2P^*$ is a reference catalyst wherein the $Fe(NO_3)_3$ is replaced by $Ni(NO_3)_2$ for growing $Ni_2P$ on the Ni foam surface by the same experimental conditions; the asterisk ("*") is utilized to denote that this $Ni_2P^*$ is different from $Ni_2P$ samples naturally grown without using $Ni(NO_3)_2$.

Electrochemical Characterization. The electrochemical tests were performed via a typical three-electrode configuration in 100 mL 1 M KOH electrolyte. Polarization curves for the HER were recorded by linear sweep voltammetry with a scan rate of 1.0 mV $s^{-1}$. For the OER and overall water splitting, in order to minimize the effect of capacitive current originating from the Ni ions oxidation on the catalytic performance, cyclic voltammetry (CV) curves with the forward and backward sweeps with a very small scan rate of 1 mV $s^{-1}$ were utilized to calculate the average activity. A carbon paper was used as the counter electrode for both the HER and OER tests. The scan rate for the cycling tests was set to 50 mV $s^{-1}$. The potentials were converted to reversible hydrogen electrode (RHE).

Computational Methods. At the generalized gradient approximation (GGA) level of density functional theory (DFT) was employed to calculate the relative energies of relevant structures. More specifically, Perdew-Burke-Ernzerhof (PBE) functional with a D3 correction was used for both geometry optimizations and the single point free energies. Geometry optimizations were performed in the Vienna Ab initio Simulation Package (VASP) with projected augmented wave (PAW) and VASPsol solvation method. Kinetic energy cutoff for geometry optimization is 300 eV and, for single point energy it is 13 Hartree (3.54 eV). Single point free energies are calculated in jDFTx with charge-asymmetric nonlocally-determined local-electric solvation model (CANDLE) implicit solvation and Garrity-Bennett-Rabe-Vanderbilt ultra-soft pseudopotentials (GBRV uspp). The final free energy G was calculated as $G = F - n_e U + ZPE + H_{vib} - TS_{vib}$, where F is the energy of the solvated Kohn-Sham DFT electronic system, $n_e$ is the number of electrons in the system, and U is the chemical potential for elections. jDFTx and VASPsol are solution packages built on joint DFT and VASP, respectively.

Results

Example 1: Electrocatalyst Synthesis and Characterization

Figure 1D:
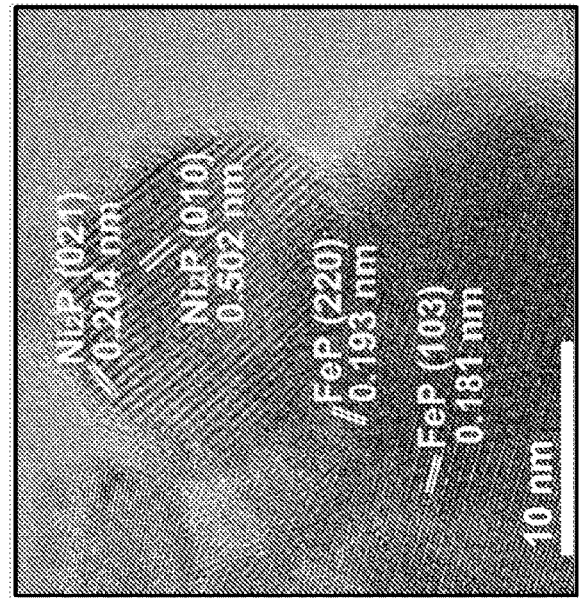
FIG. 1d provides a typical HRTEM image taken from the FeP/$Ni_2P$ catalysts of Example 1.
Figure 1A:
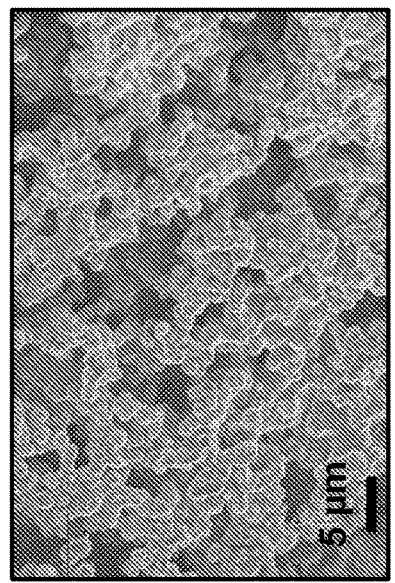
FIG. 1a provides low-magnification SEM images of FeP/$Ni_2P$ nanoparticles supported on 3D Ni foam of Example 1.
Figure 1C:
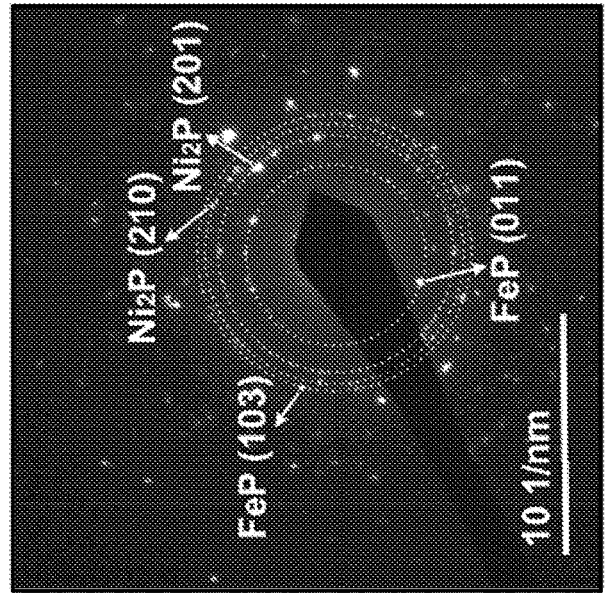
FIG. 1c provides the SAED pattern taken from the FeP/$Ni_2P$ catalysts of Example 1.
Figure 1E:
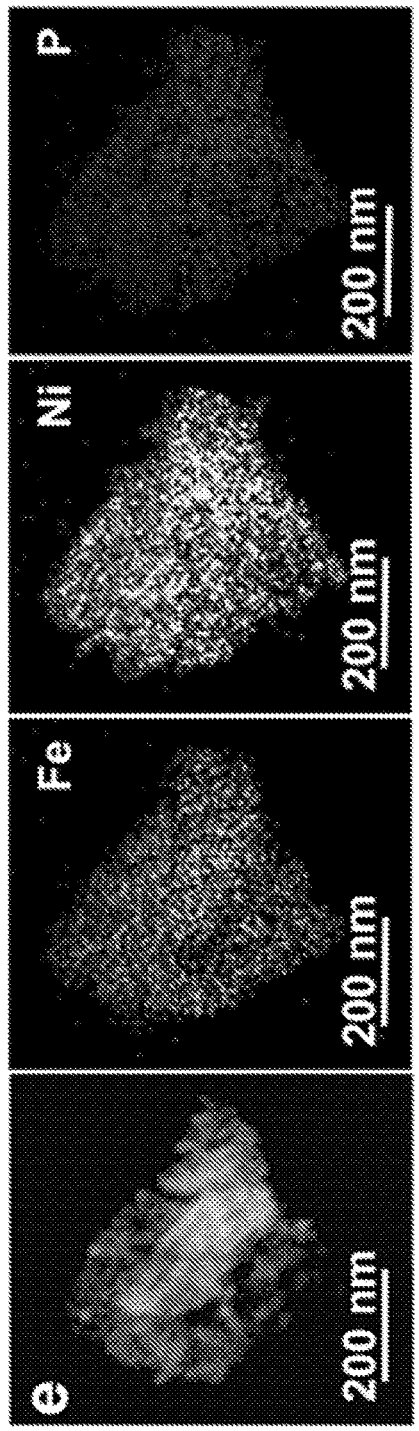
FIG. 1e shows the TEM image and corresponding EDX elemental mapping of the as-prepared samples of Example 1.
Figure 1G:
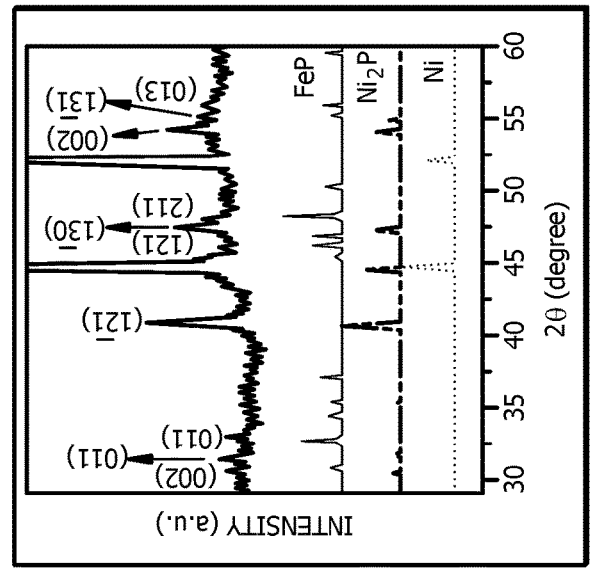
FIG. 1g is a typical XRD pattern of the samples of Example 1.
Figure 1F:
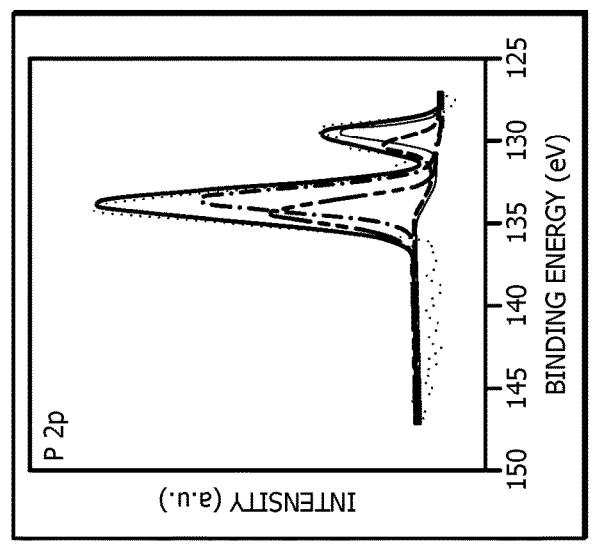
FIG. 1f is an XPS analysis of as-prepared samples of Example 1.
Figure 1H:
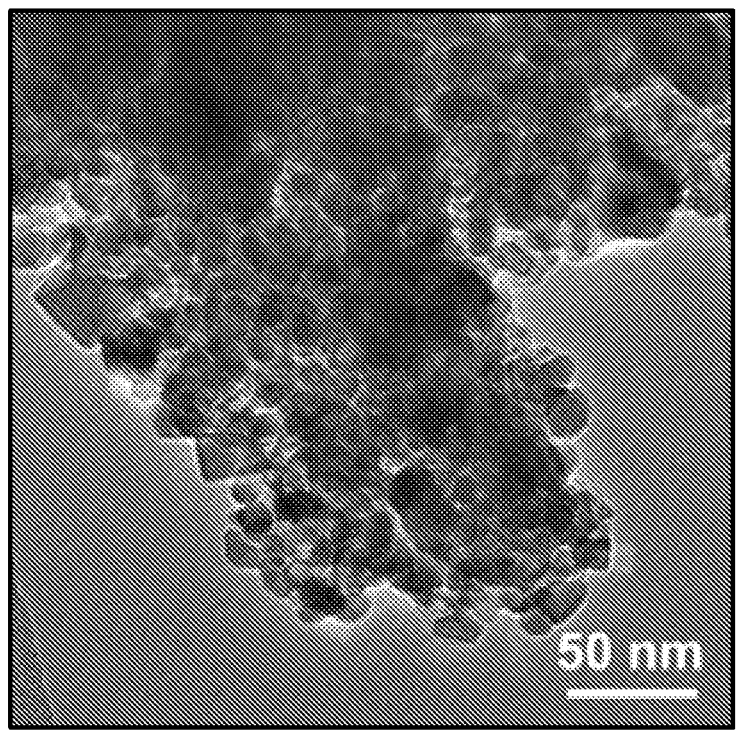
FIG. 1h is a typical TEM image of as-prepared FeP/$Ni_2P$ nanoparticles of Example 1.

An Fe—Ni—P hybrid architecture was prepared directly on commercial Ni foams by a thermal treatment process. Following synthesis, microscopic characterization of as-prepared FeP/$Ni_2P$ hybrid included scanning electron microscopy (SEM). FIG. 1a and FIG. 1b provide low- and high-magnification SEM images of FeP/Ni$_2$P nanoparticles supported on 3D Ni foam. The typical scanning electron microscopy (SEM) images of FIG. 1a and FIG. 1b show that the as-prepared samples are free-standing with abundant mesopores and/or nanopores at the surface, indicating efficacious achievement of large surface areas for facile exchange of proton or oxygen-containing intermediates. In particular, numerous nanocrystals are distributed uniformly at the surface, forming plentiful surface active sites in this hybrid catalyst. FIG. 1c and FIG. 1d provide the SAED pattern and a typical HRTEM image, respectively, taken from the FeP/Ni$_2$P catalysts. FIG. 1h is a typical TEM image of as-prepared FeP/Ni$_2$P nanoparticles. The selected area electron diffraction (SAED) pattern (FIG. 1c), combined with high-resolution transmission electron microscopy (TEM) images (FIG. 1d, FIG. 1h), further reveal the nanoscale features of the FeP and Ni$_2$P particles with diameters of 5-30 nm. The interplanar spacings of these nanoparticles are resolved by TEM to be around 0.204 and 0.502 nm corresponding to the (021) and (010) planes of Ni$_2$P crystals, and 0.181 and 0.193 nm corresponding to the (103) and (220) planes of FeP crystals.

Figure 1I:
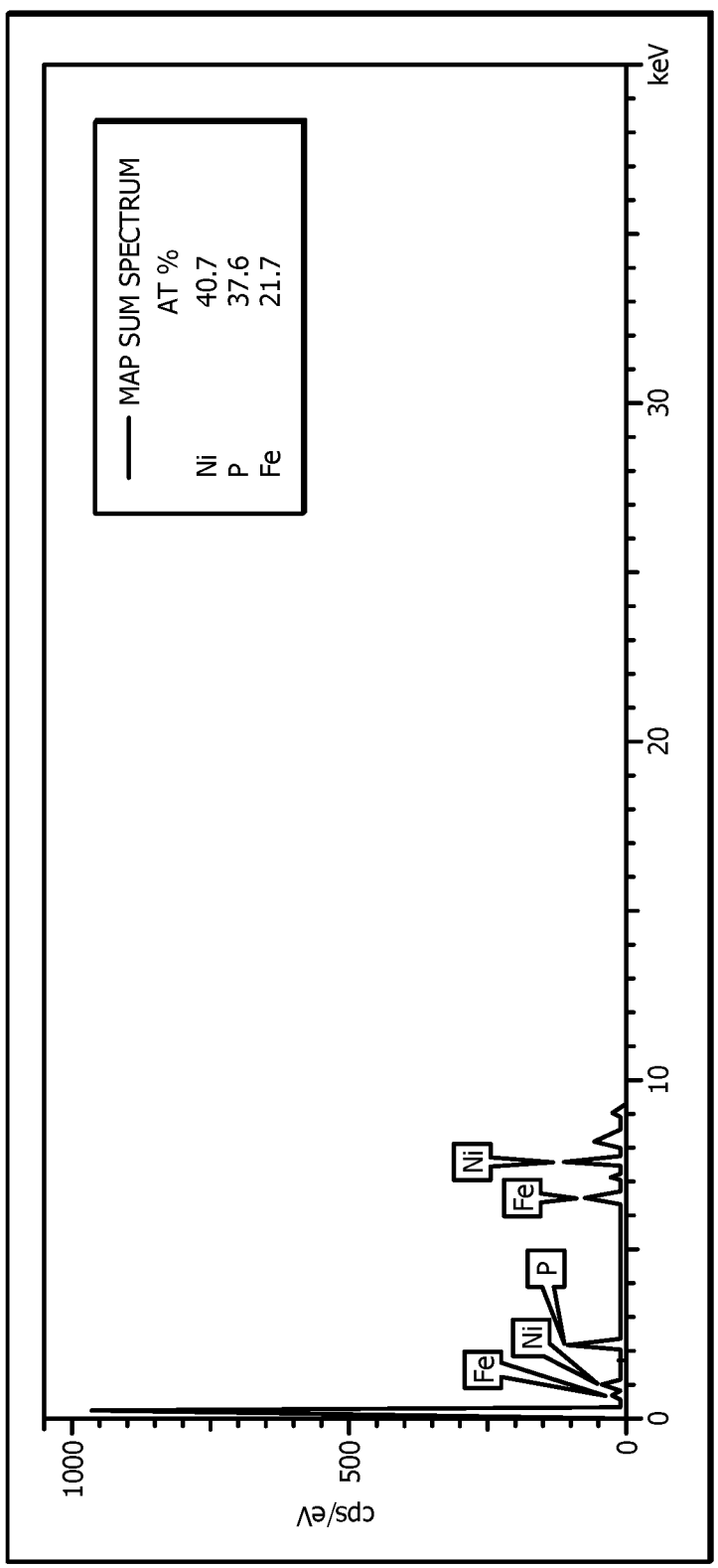
FIG. 1i is an energy dispersive X-ray (EDX) spectrum of FeP/$Ni_2P$ nanoparticles of Example 1.

To determine the distribution of Ni, Fe, and P elements in the as-prepared samples, elemental mapping was carried out using TEM, confirming the homogenous distribution of Ni, Fe, and P elements in the FeP/Ni$_2$P nanoparticles. FIG. 1e shows the TEM image and corresponding EDX elemental mapping of the as-prepared samples. FIG. 1i is an energy dispersive X-ray (EDX) spectrum of FeP/Ni$_2$P nanoparticles. The energy dispersive X-ray (EDX) spectrum of FIG. 1i shows that the Ni, Fe, and P elements are present with an atomic ratio close to 2:1:2, consistent with the high-resolution TEM observations.

Figure 2B:
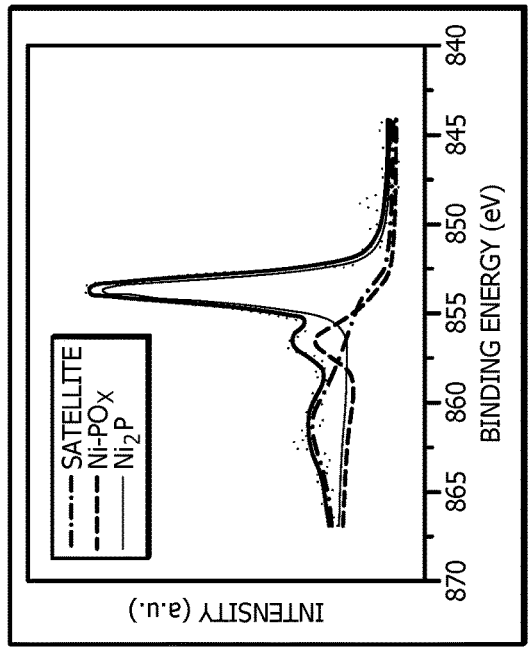
FIG. 2b shows XPS analysis of the original FeP/$Ni_2P$ hybrid catalyst of Example 1: Ni $2p^{3/2}$.
Figure 2C:
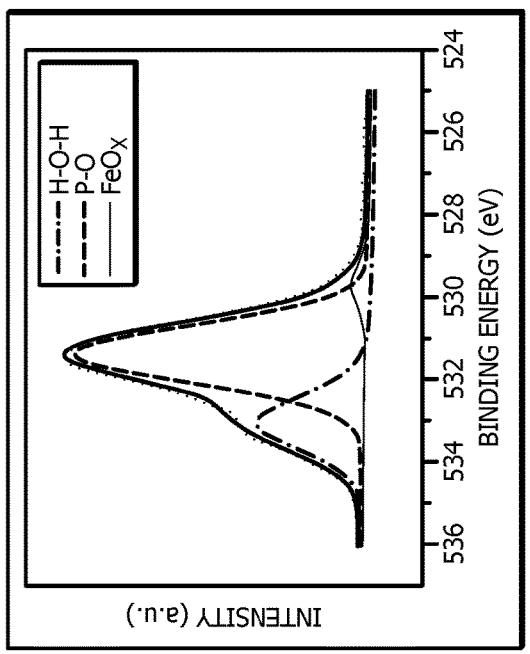
FIG. 2c shows XPS analysis of the original FeP/$Ni_2P$ hybrid catalyst of Example 1: O 1s.
Figure 2A:
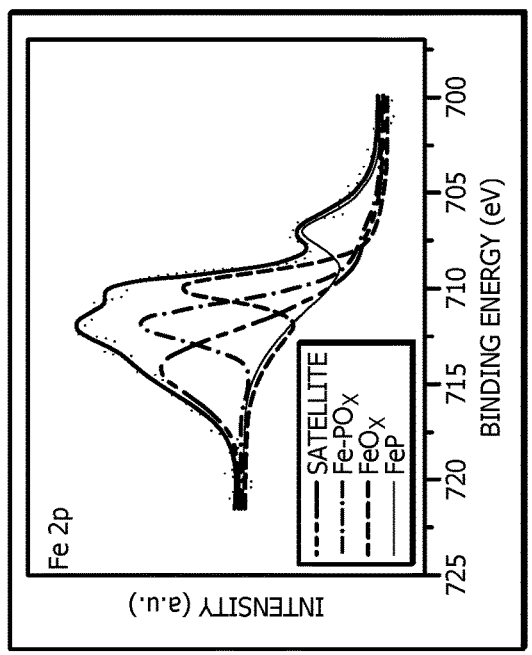
FIG. 2a shows XPS analysis of the original FeP/$Ni_2P$ hybrid catalyst of Example 1: Fe $2p^{3/2}$.

The chemical composition and oxidation states of the catalysts were further unveiled by X-ray photoelectron spectroscopy (XPS) and X-ray diffraction (XRD). As seen in FIG. 1f, which is an XPS analysis, the P 2p core level spectrum can be fit with two doublets, with one located at the binding energies of 129.3 and 130.1 eV attributing to phosphorus anions of metal phosphides, and the other at 133.5 and 134.3 eV indicative of phosphate-like P arisen from possible surface oxidation. FIGS. 2a-c show XPS analysis of the original FeP/Ni$_2$P hybrid catalyst (a) Fe 2p$^{3/2}$, (b) Ni 2p$^{3/2}$, and (c) O 1s, respectively. As seen in FIG. 2a, the XPS spectrum of Fe 2p3/2 core level can be deconvoluted into three main peaks with binding energies of 707.0, 709.9, and 711.9 eV assigned to FeP, Fe-based oxide and phosphate, respectively, caused by possible superficial oxidation when exposing FeP samples to air, while another peak located at 714.3 eV is arisen from the relevant satellite peak. As seen in FIG. 2b, this peak deconvolution is also applied to the Ni 2p$^{3/2}$ core level spectrum, where three binding energies located at 853.6, 856.4, and 861.0 eV are ascribed to Ni$_2$P, Ni—PO$_x$, and the corresponding satellite peak, respectively. As seen in FIG. 1g, which is a typical XRD pattern of the samples (to better view the peaks from the catalysts, the full intensity of the peaks from Ni are not shown in FIG. 1g), the typical XRD pattern reveals the main indexes from the as-prepared FeP/Ni$_2$P hybrid and Ni foam support. The two strongest peaks at 45° and 52° are mainly originated from the Ni foam support (ICSD-53809). The other peaks are those characteristic of FeP (ICSD-633046) and Ni$_2$P (ICSD-646102), consistent with the TEM analysis.

Example 2: Oxygen Evolution Catalysis

Figure 3A:
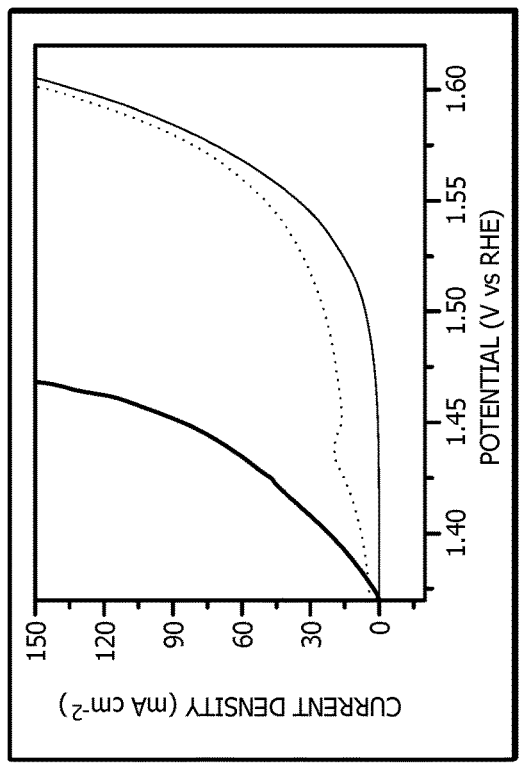
FIG. 3a provides representative polarization curves, which show the geometric current density plotted against applied potential vs. reversible hydrogen electrode (RHE) of the Fe—Ni—P hybrid electrode of this disclosure and Example 2 relative to $Ni_2P$ and benchmark $IrO_2$ catalysts.
Figure 3B:
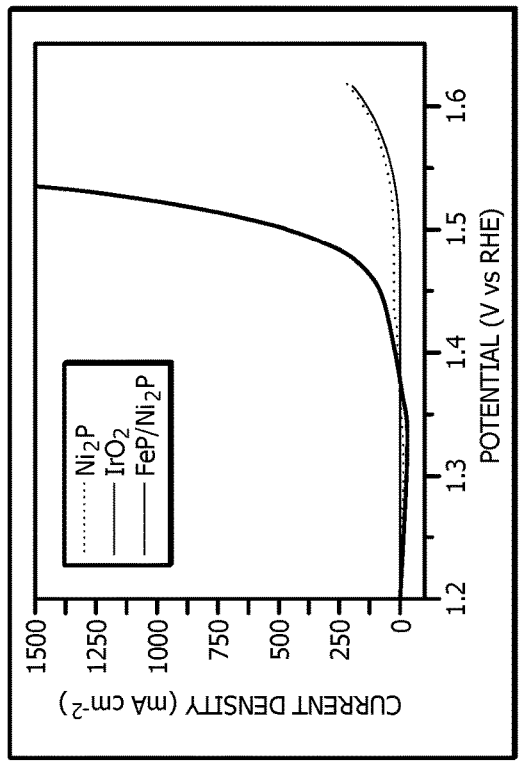
Figure 4A:
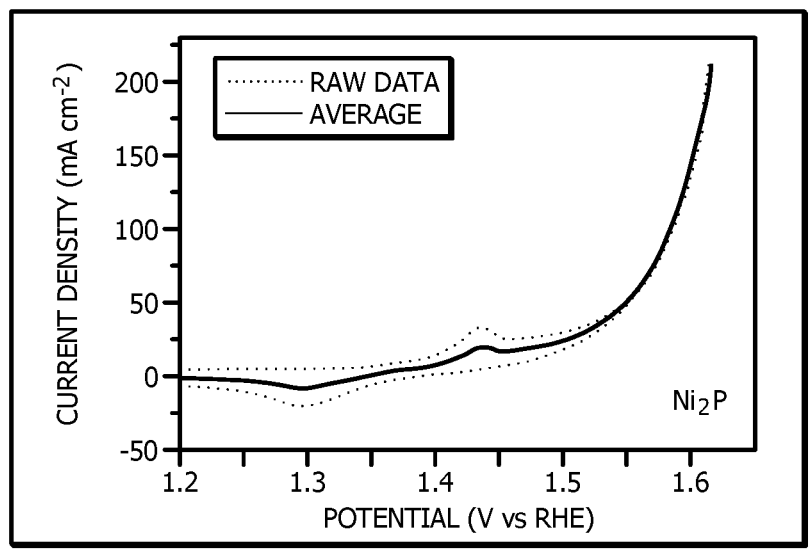
FIG. 4a shows cyclic voltammetry (CV) curves (raw data) and corresponding average activity calculated from the backward and forward CV curves for $Ni_2P$, obtained with a scan rate of 1 mV $s^{-1}$.
Figure 4B:
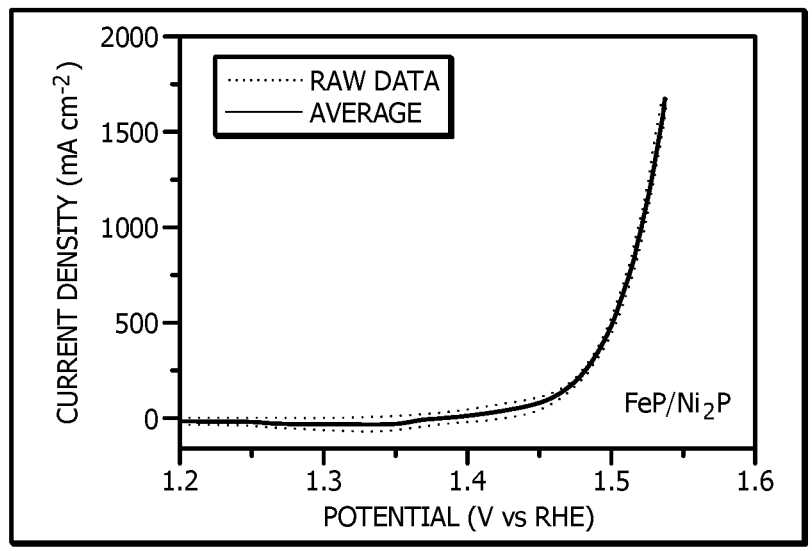
FIG. 4b shows cyclic voltammetry (CV) curves (raw data) and corresponding average activity calculated from the backward and forward CV curves for FeP/$Ni_2P$, obtained with a scan rate of 1 mV $s^{-1}$.

The catalytic OER activity of the Fe—Ni—P hybrid catalyst of Example 1 was evaluated in 1.0 M KOH aqueous electrolyte. FIG. 3a and FIG. 3b provide representative polarization curves which show the geometric current density plotted against applied potential vs. reversible hydrogen electrode (RHE) of the Fe—Ni—P hybrid electrode relative to Ni$_2$P and benchmark IrO$_2$ catalysts. FIG. 3b provides the enlarged region of the curves in FIG. 3a. FIG. 4a and FIG. 4b show a cyclic voltammetry (CV) curve (raw data) and corresponding average activity calculated from the CV curve for Ni$_2$P and FeP/Ni$_2$P, respectively, obtained with a scan rate of 1 mV s$^{-1}$. The effect of capacitive current on the catalytic activity, originating from the Ni ions oxidation, is minimized by calculating the average activity from the forward and backward sweeps of a cyclic voltammetry (CV) curve. Strikingly, as seen from FIG. 4a and FIG. 4b, the Fe—Ni—P hybrid requires an overpotential of only 154 mV to deliver 10 mA/cm$^2$, which is 127 mV less than the state-of-the-art IrO$_2$ catalyst (281 mV). At 281 mV, the herein-disclosed FeP/Ni$_2$P catalyst achieves a current density up to 690 mA/cm$^2$, which is 69-fold higher than the benchmark IrO$_2$, demonstrating a substantial improvement of the OER activity. Indeed, as seen in Table 1 below, this overpotential of 154 mV in alkaline conditions is among the lowest for catalyzing OER thus far, even surpassing the presently most active NiFe LDH (double layered hydroxide) catalyst (~200 mV).

Table 1 provides a comparison of catalytic performance of the herein-disclosed FeP/Ni$_2$P electrocatalyst with the most recently reported OER catalysts. In Table 1, $\eta_{10,OER}$ corresponds to the overpotential of OER catalyzed at a current density of 10 mA cm$^{-2}$, while $j_{300,OER}$ corresponds to the current density at 300 mV overpotential for the OER.

TABLE 1

Comparison of Catalytic Performance of FeP/Ni$_2$P Electrocatalyst with Reported OER Catalysts

| OER catalysts | Electrolytes | $\eta_{10,OER}$ (mV) | Tafel (mV dec$^{-1}$) | Source |
| --- | --- | --- | --- | --- |
| FeP/Ni$_2$P | 1.0M KOH | 154 | 22.7 | Herein-Disclosed |
| Gelled FeCoW | 1.0M KOH | 191 | 22.7 | Reference |
| Ni$_x$Fe$_{1-x}$Se$_2$—DO | 1.0M KOH | 195 | 28 | Reference |
| NiCeO$_x$—Au | 1.0M NaOH | 270 | — | Reference |
| Ni$_2$P nanoparticles | 1.0M KOH | 290 | 59 | Reference |
| Co$_4$N | 1.0M KOH | 257 | 44 | Reference |
| h-NiS$_x$ | 1.0M KOH | 180 | 96 | Reference |
| FeP-rGO | 1.0M KOH | 260 | 49.6 | Reference |

TABLE 1-continued

Comparison of Catalytic Performance of FeP/Ni$_2$P
Electrocatalyst with Reported OER Catalysts

| Bifunctional catalysts for the OER | Electrolytes | $\eta_{10, OER}$ (mV) | $j_{300, OER}$ (mA cm$^{-2}$) | Source |
|---|---|---|---|---|
| FeP/Ni$_2$P | 1.0M KOH | 154 | 1277 | Herein-Disclosed |
| Porous MoO$_2$ | 1.0M KOH | 260 | 41* | Reference |
| Ni$_{0.51}$Fe$_{0.49}$P film | 1.0M KOH | 239 | 80* | Reference |
| MoS$_2$/Ni$_3$S$_2$ | 1.0M KOH | 218 | 100* | Reference |
| CoP$_2$/rGO | 1.0M KOH | 300 | 10 | Reference |
| NiCo$_2$S$_4$ nanowire array | 1.0M KOH | 260 | 19* | Reference |
| Electrodeposited CoP film | 1.0M KOH | 345 | 0.5* | Reference |
| NiCO$_2$O$_4$ | 1.0M KOH | 290 | 24* | Reference |
| EG/Co$_{0.85}$Se/NiFe—LDH | 1.0M KOH | 206 | 300* | Reference |
| NiFe LDH | 1.0M KOH | 240 | 30* | Reference |
| NiFe LDH@DG10 | 1.0M KOH | 201 | 77.5* | Reference |
| NiFe LDH/Cu NW | 1.0M KOH | 199 | 214* | Reference |
| NiFeO$_x$/CFP | 1.0M KOH | 230 | 400* | Reference |
| NiP/Ni | 1.0M KOH | 247 | 50* | Reference |

Figure 3C:
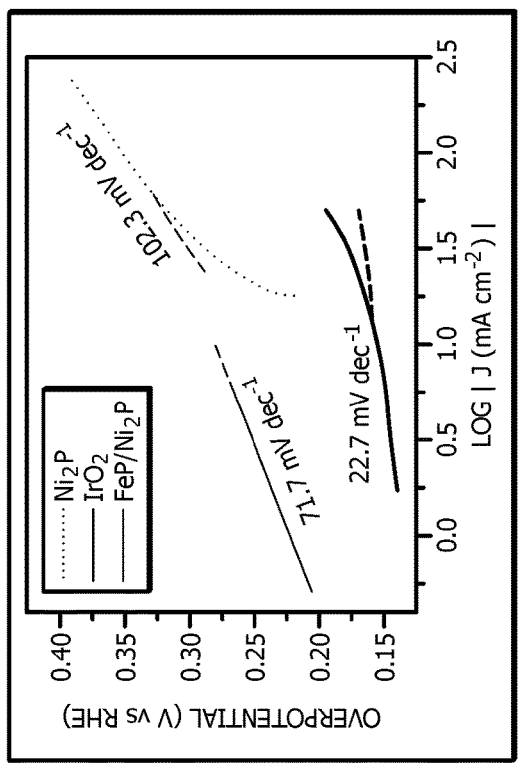
FIG. 3c provides the corresponding Tafel plots for the catalysts of Example 2.
Figure 3D:
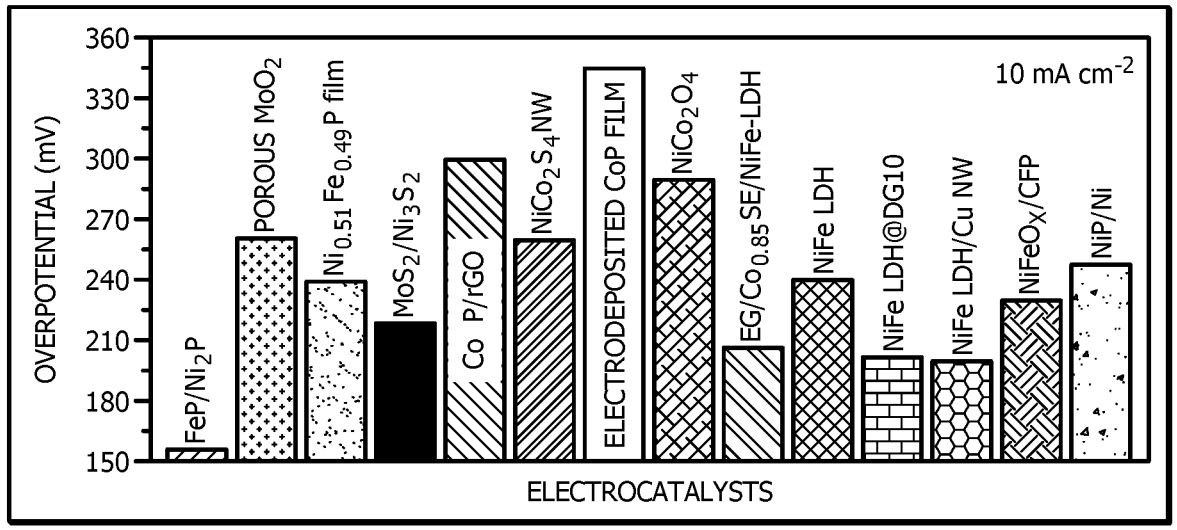
FIG. 3d provides a comparison of the overpotentials required at 10 mA $cm^{-2}$ between the herein-disclosed FeP/$Ni_2P$ catalyst and available reported OER catalysts.
Figure 3E:
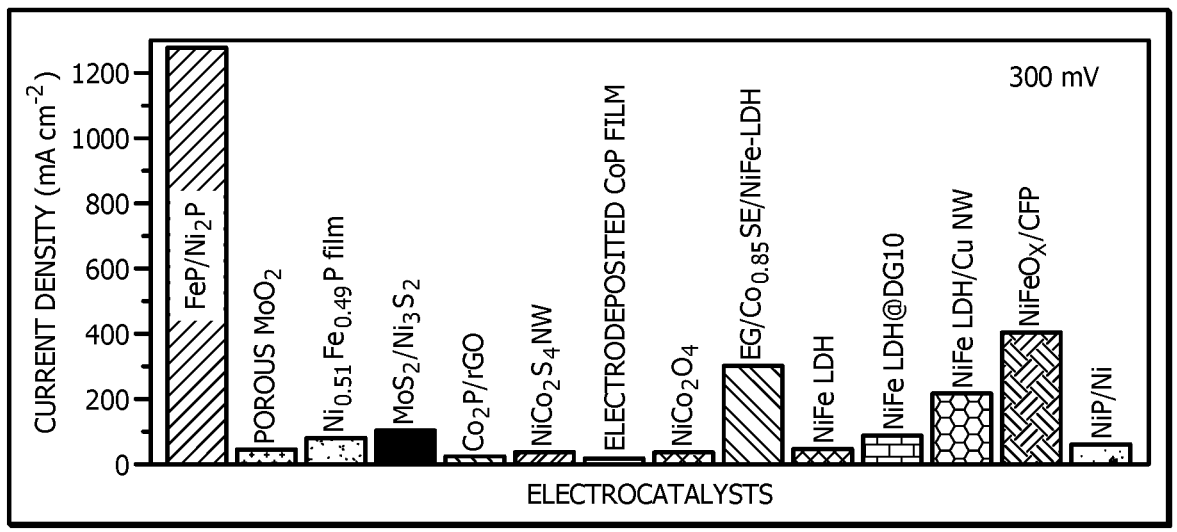
FIG. 3e provides a comparison of the current densities delivered at 300 mV between the herein-disclosed FeP/$Ni_2P$ catalyst and available reported OER catalysts.

FIG. 3c provides the Tafel plots corresponding to the data in FIG. 3a and FIG. 3b. As seen in FIG. 3c, a very small Tafel slope of 22.7 mV dec$^{-1}$ was measured, which is much smaller than those of the reference materials Ni$_2$P (102.3 mV dec$^{-1}$) and IrO$_2$ (71.7 mV dec$^{-1}$), and also smaller than most of the OER catalysts reported, for example, in Table 1. Specifically, the OER activity of the herein-disclosed FeP/Ni$_2$P catalyst was compared with other available bifunctional catalysts as shown in FIG. 3d and FIG. 3e, which provide a comparison of the overpotentials required at 10 mA cm$^{-2}$ between the herein-disclosed catalyst and available reported OER catalysts and a comparison of the current densities delivered at 300 mV between the herein-disclosed catalyst and available reported OER catalysts, respectively. From FIG. 3d and FIG. 3e, it is evident that the herein-disclosed FeP/Ni$_2$P catalyst requires the lowest overpotential (e.g., 154 mV) to achieve 10 mA/cm$^2$, and the largest current density (1277 mA/cm$^2$) at 300 mV overpotential, indicating the potential to be used for overall water splitting with large current densities at small cell voltage.

Figure 3G:
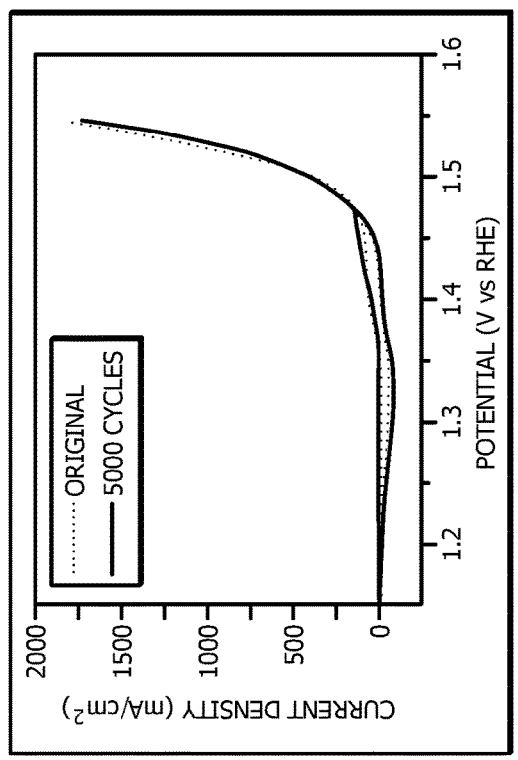
FIG. 3g provides CV curves of FeP/$Ni_2P$ before and after the acceleration durability test for 5000 cycles of Example 2.
Figure 3F:
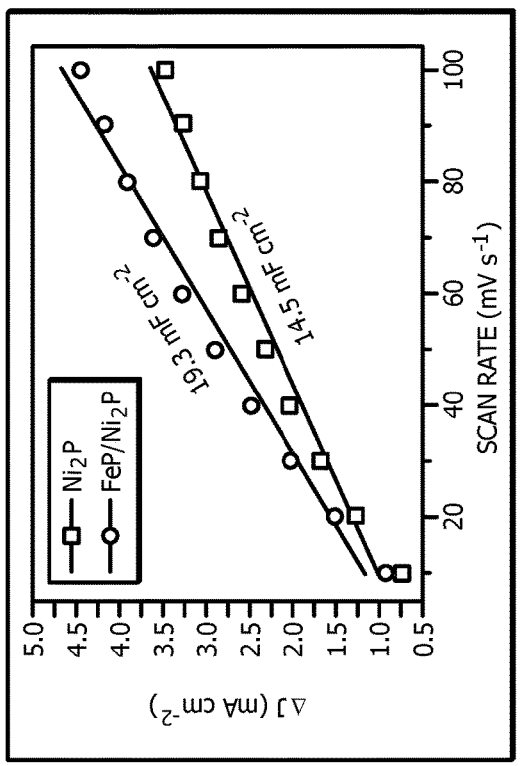
FIG. 3f shows the double-layer capacitance ($C_{dl}$) measurements of $Ni_2P$ and FeP/$Ni_2P$ catalysts of Example 2.
Figure 5A:
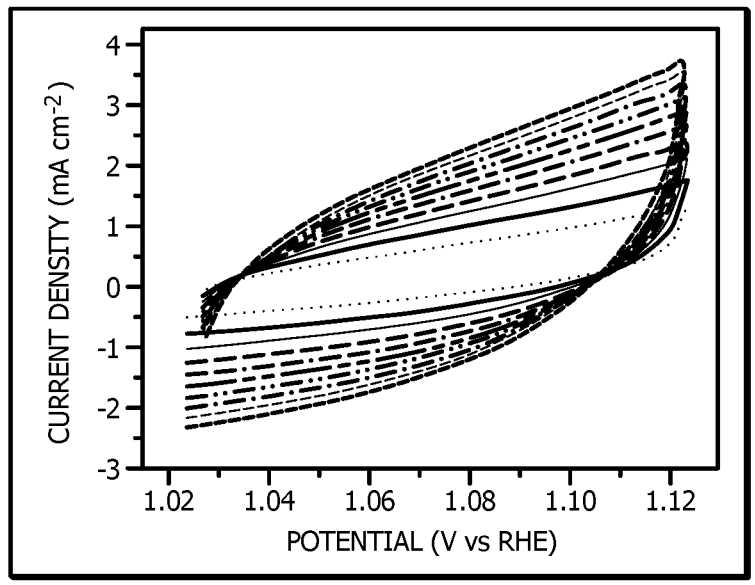
FIG. 5a shows the scan rate dependence of the CV curves for $Ni_2P$ as OER catalyst, with scan rates ranging from 10 mV $s^{-1}$ to 100 mV $s^{-1}$ at intervals of 10 mV $s^{-1}$.
Figure 5B:
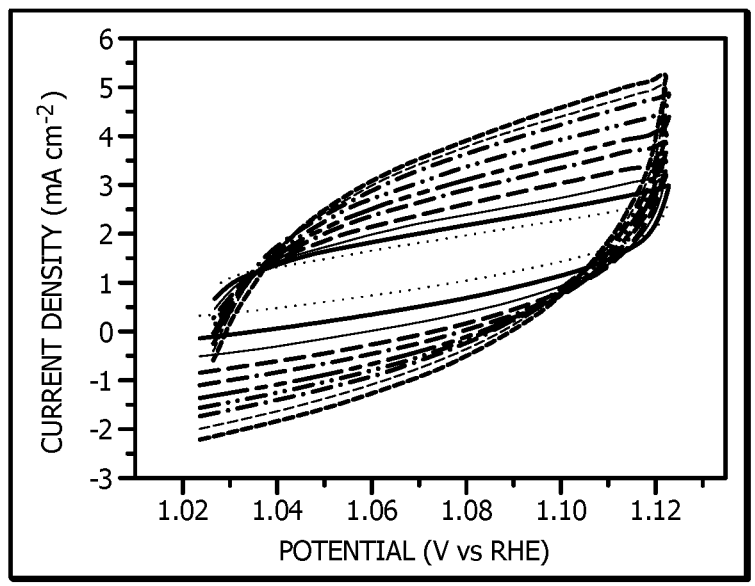
FIG. 5b shows the scan rate dependence of the CV curves for FeP/$Ni_2P$ as OER catalyst, with scan rates ranging from 10 mV $s^{-1}$ to 100 mV $s^{-1}$ at intervals of 10 mV $5^{-1}$.
Figure 6:
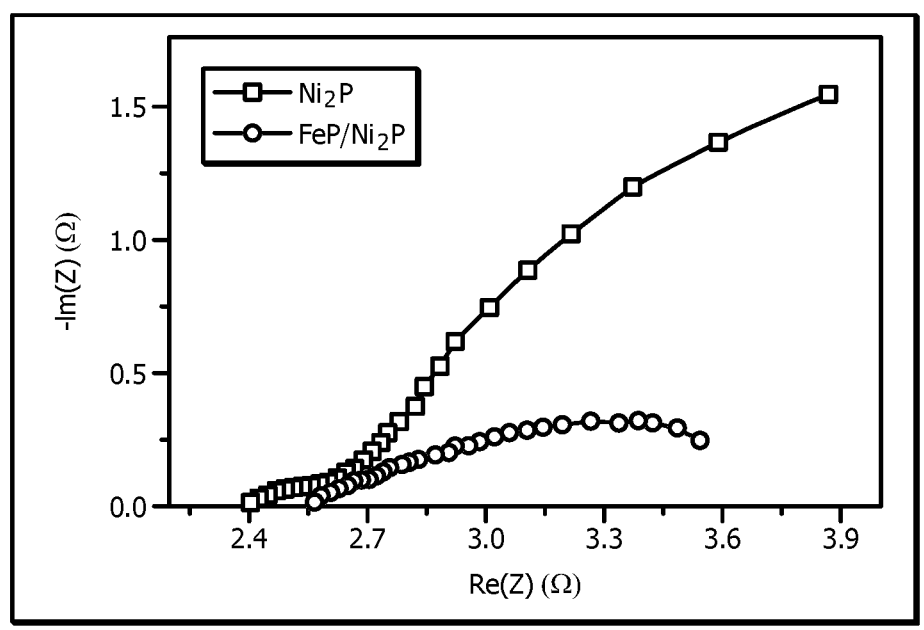
FIG. 6 shows Nyquist plots of electrochemical impedance spectroscopy (EIS) for OER catalyzed by $Ni_2P$ and FeP/$Ni_2P$ at an overpotential of 300 mV.

To elucidate the origins of the remarkably high OER catalytic activity of the herein-disclosed FeP/Ni$_2$P catalyst, electrochemical impedance spectroscopy (EIS) and double-layer capacitance (Cdl) investigations were performed on this FeP/Ni$_2$P electrode. FIG. 5a and FIG. 5b show the scan rate dependence of the current densities for Ni$_2$P and FeP/Ni$_2$P as OER catalysts, respectively, with scan rates ranging from 10 mV s$^{-1}$ to 100 mV s$^{-1}$ at intervals of 10 mV s$^{-1}$. FIG. 3f shows the double-layer capacitance (C$_{dl}$) measurements of Ni$_2$P and FeP/Ni$_2$P catalysts. As seen in FIG. 3f, this capacitance C$_{dl}$ determined by a simple cyclic voltammetry method (FIG. 5) is calculated to be 19.3 mF/cm$^2$ for the Fe—Ni—P hybrid electrode, very close to that of the Ni$_2$P catalyst (14.5 mF/cm$^2$). This manifests that depositing FeP on the Ni$_2$P surface doesn't result in huge changes in the active surface area, while the electrochemical OER performance of FeP/Ni$_2$P is much better than Ni$_2$P. For instance, the herein-disclosed FeP/Ni$_2$P hybrid achieves 1000 mA/cm$^2$ at 293 mV, while Ni$_2$P can deliver only 32 mA/cm$^2$ at this overpotential, making our FeP/Ni$_2$P catalyst ~30-fold better than the Ni$_2$P catalyst, heralding that unexpected synergistic effects between FeP and Ni$_2$P in the hybrid is the main contributor to the superior catalytic performance provided thereby, not just the high active surface area. FIG. 6 shows Nyquist plots of electrochemical impedance spectroscopy (EIS) for OER catalyzed by Ni$_2$P and FeP/Ni$_2$P at an overpotential of 300 mV. As seen in FIG. 6, the EIS spectra show that the herein-disclosed FeP/Ni$_2$P hybrid has a lower charge-transfer resistance at the interface of the catalysts with Ni foam, leading to faster OER kinetics compared to the Ni$_2$P catalyst. Therefore, without wishing to be limited by theory, the excellent OER activity of the herein-disclosed FeP/Ni$_2$P hybrid catalyst may be attributed to fast electron transport and synergistic effects between FeP and Ni$_2$P.

Figure 3H:
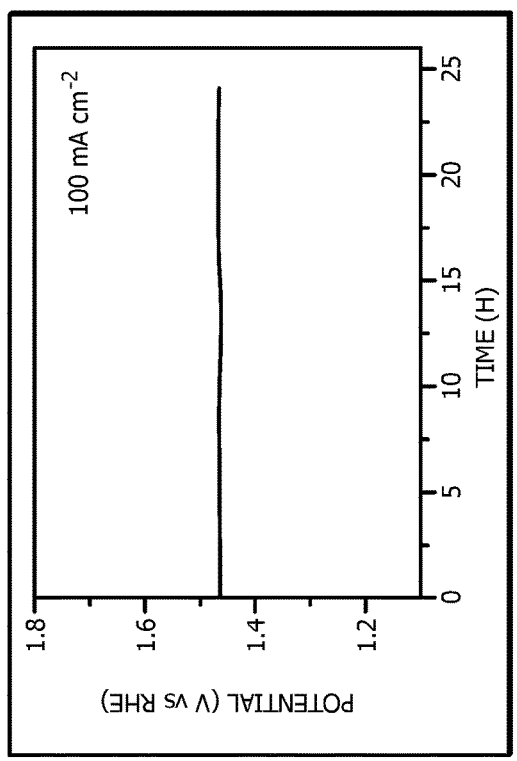
FIG. 3h provides the time-dependent potential curve for the herein-disclosed FeP/$Ni_2P$ catalyst of Example 2 at 100 mA $cm^{-2}$
Figure 7A:
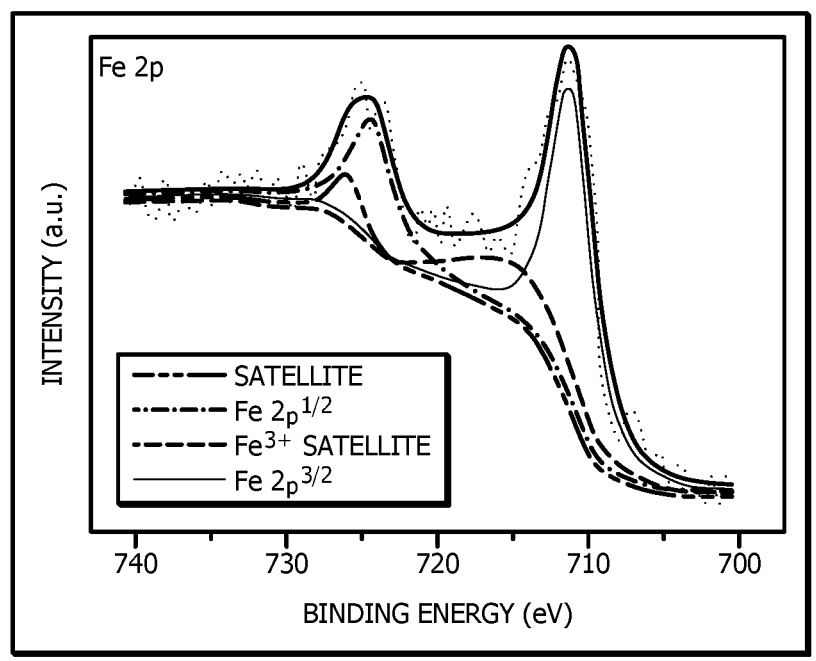
FIG. 7a provides XPS analysis of the post-OER samples of Example 2: Fe 2p region.
Figure 7B:
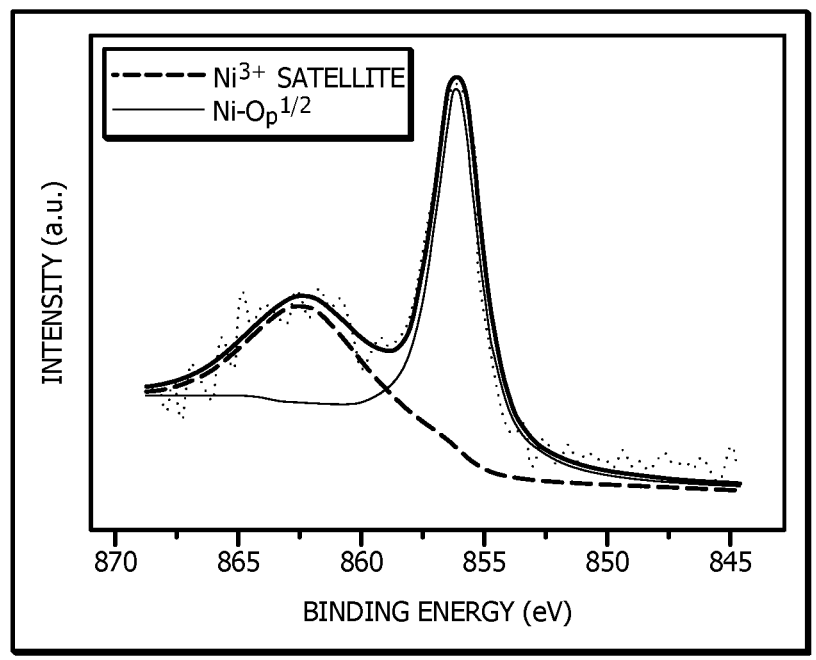
FIG. 7b provides XPS analysis of the post-OER samples of Example 2: Ni $2p^{3/2}$ region.
Figure 7C:
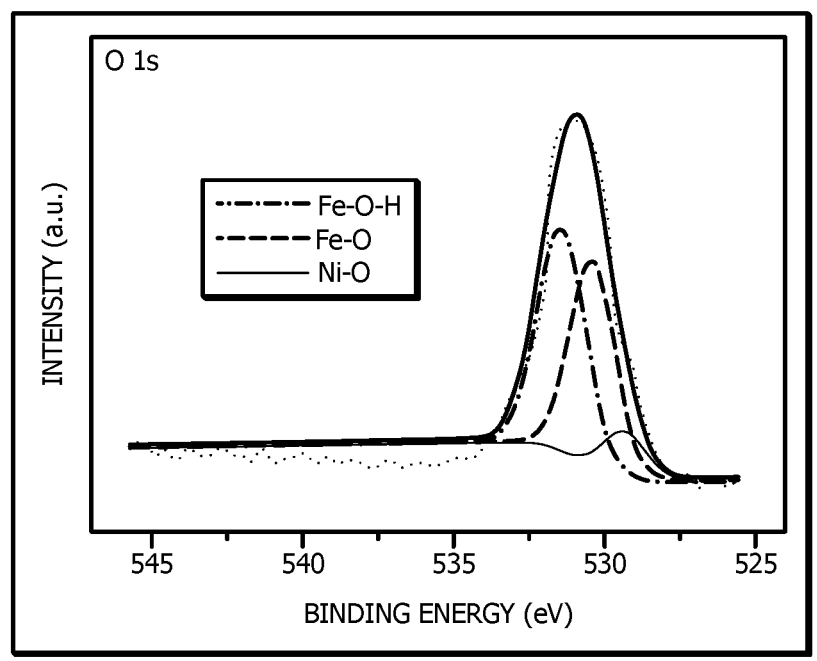
FIG. 7c provides XPS analysis of the post-OER samples of Example 2: O 1s region.
Figure 7D:
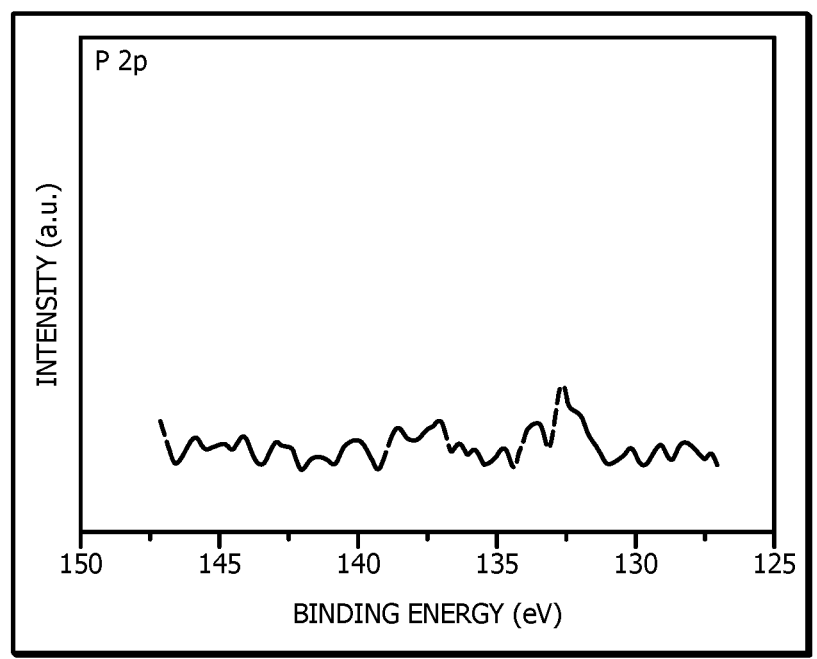
FIG. 7d provides XPS analysis of the post-OER samples of Example 2: P 2p region.
Figure 8:
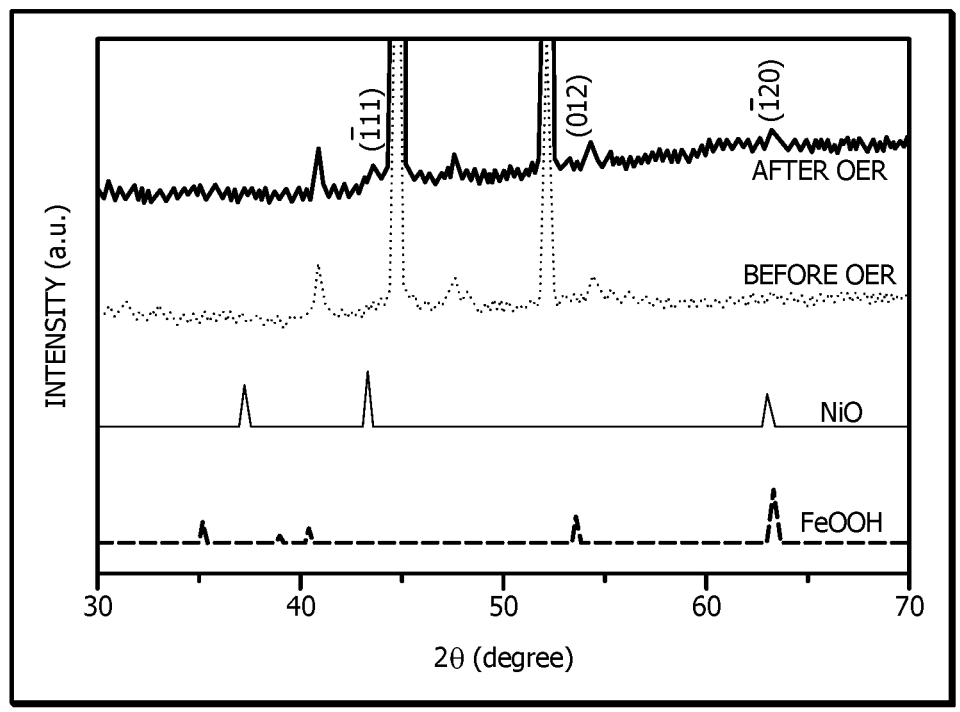
FIG. 8 provides XRD patterns of the FeP/$Ni_2P$ nanoparticles of Example 2 after OER testing in comparison with that before the OER testing.

Electrochemical durability is another key index that can be utilized to evaluate the performance of electrocatalysts. FIG. 3g provides CV curves of FeP/Ni$_2$P before and after the acceleration durability test for 5000 cycles. Obviously, as seen in FIG. 3g, after 5000 cycling test, the CV curve of the FeP/Ni$_2$P hybrid of this disclosure is nearly identical to the original one, suggesting its excellent durability during cycling scans. The long-term electrochemical stability of the catalyst tested at 100 mA/cm$^2$ was probed. FIG. 3h provides the time-dependent potential curve for the herein-disclosed FeP/Ni$_2$P catalyst at 100 mA cm$^{-2}$. As seen in FIG. 3h, the real-time potential remained nearly constant during a 24 h continuous operation. These results establish the strong durability of the herein-disclosed FeP/Ni$_2$P catalyst for OER in alkaline electrolyte. Further insights into the chemical compositions for post-OER samples were determined by XPS and XRD. FIGS. 7a-7d provide XPS analysis of the post-OER samples: FIG. 7a—Fe 2p region; FIG. 7b Ni 2p$^{3/2}$ region; FIG. 7c—O 1s region; and FIG. 7d—P 2p region. FIG. 8 provides XRD patterns of the FeP/Ni$_2$P nanoparticles after OER testing. Without wishing to be limited by theory, from the XPS spectra of FIGS. 7a-7d and the XRD patterns of FIG. 8, it appears that a mixture of nickel and iron oxides/oxyhydroxides evolves at the surface of the FeP/Ni$_2$P hybrid during OER.

Example 3: Hydrogen Evolution Catalysis

Figure 13:
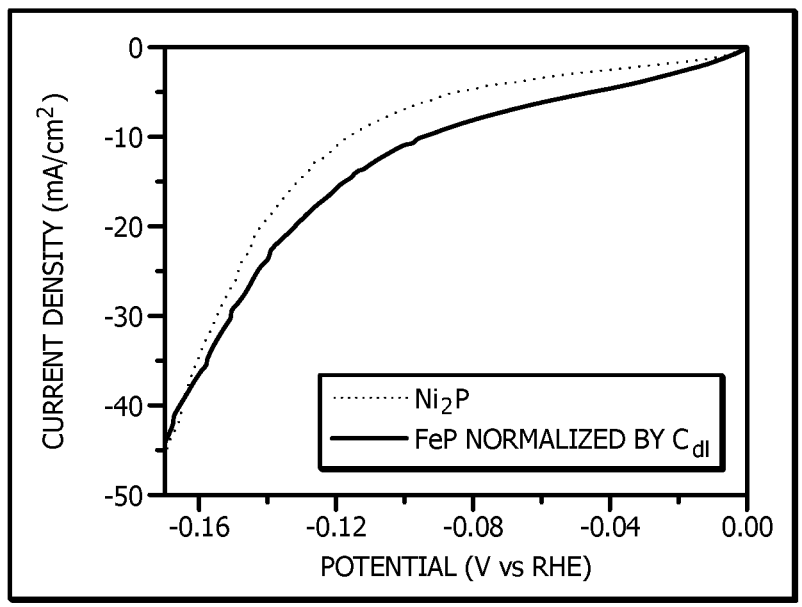
FIG. 13 provides a comparison of the catalytic HER activity with the same active surface area normalized by the $C_{dl}$ difference between FeP/$Ni_2P$ hybrid and pure $Ni_2P$* catalyst of Example 3.

Electrocatalytic hydrogen evolution reaction in 1 M KOH electrolyte using the herein-disclosed FeP/Ni$_2$P electrocatalyst was studied. In addition to the excellent OER performance, the herein-disclosed FeP/Ni$_2$P hybrid is highly active towards HER in the same electrolyte. FIG. 9a provides the HER polarization curves of different catalysts. FIG. 10 shows enlarged polarization curves of different HER electrocatalysts. From FIG. 9A and FIG. 10, it is evident that the bare Ni$_2$P is not a good HER catalyst, as it requires a large overpotential of −150 mV to deliver a current density of −10 mA/cm$^2$. Conversely, the herein-disclosed FeP/Ni$_2$P hybrid unexpectedly obtains −10 mA/cm$^2$ at an extremely low overpotential of −14 mV. As seen in Table 2, which provides a comparison of catalytic performance of the herein-disclosed FeP/Ni$_2$P catalyst with available non-noble HER catalysts in alkaline electrolytes, this low overpotential of −14 mV is the lowest value among non-noble metal-based HER catalysts, and indeed is comparable to that of Pt (−59 mV) in alkaline electrolyte. In Table 2, $\eta_{10,HER}$ corresponds to the overpotential of HER catalyzed at 10 mA cm$^{-2}$, and $j_{200,HER}$ is related to the current density at 200 mV overpotential.

foam with similar mass loading in the same growth conditions as FeP/Ni$_2$P. In this case, the comparative Ni$_2$P* catalyst still showed catalytic activity inferior to the FeP/Ni$_2$P hybrid, and had a smaller C value (FIG. 9c). FIG. 13 provides a comparison of the catalytic HER activity with the same active surface area normalized by the $C_{dl}$ difference between FeP/Ni$_2$P hybrid and just Ni$_2$P catalyst. As seen in FIG. 13, after normalizing the polarization curves by the active surface area or $C_{dl}$ difference, the FeP/Ni$_2$P hybrid still exhibited better catalytic HER activity than pure Ni$_2$P* catalyst, indicating that the herein-disclosed FeP/Ni$_2$P had better intrinsic activity than pure Ni$_2$P* catalyst.

TABLE 2

Comparison of Catalytic Performance with Available Non-Noble HER catalysts in Alkaline Electrolytes

| HER catalysts | Electrolytes | $\eta_{10, HER}$ (mV) | Tafel (mV dec$^{-1}$) | Source |
|---|---|---|---|---|
| FeP/Ni$_2$P | 1.0M KOH | 14 | 24.2 | Herein-Disclosed |
| NiCo$_2$P$_x$ Nanowires | 1.0M KOH | 58 | 34.3 | Reference |
| Ni$_{1-x}$Co$_x$Se$_2$ nanosheet | 1.0M KOH | 85 | 52.0 | Reference |
| CoP nanowire/CC | 1.0M KOH | 209 | 129.0 | Reference |
| Co/CoP nanocrystals | 1.0M KOH | 135 | 64.0 | Reference |
| FeP nanowire arrays | 1.0M KOH | 194 | 75 | Reference |
| MoNi$_4$/MoO$_2$ cuboids | 1.0M KOH | 15 | 30.0 | Reference |
| MoP crystals | 1.0M KOH | ~140 | 48.0 | Reference |
| Ni$_5$P$_4$ (pellet) | 1.0M KOH | 48 | 98.0 | Reference |
| Nanoporous Co$_2$P | 1.0M KOH | 60 | 40.0 | Reference |

| Bifunctional catalysts for the HER | Electrolytes | $\eta_{10, HER}$ (mV) | $j_{200, HER}$ (mA cm$^{-2}$) | Source |
|---|---|---|---|---|
| FeP/Ni$_2$P | 1.0M KOH | 15 | 346* | Herein-Disclosed |
| Porous MoO$_2$ | 1.0M KOH | 27 | 132* | Reference |
| Ni$_{0.51}$Fe$_{0.49}$P film | 1.0M KOH | 82 | 236* | Reference |
| MoS$_2$/Ni$_3$S$_2$ | 1.0M KOH | 110 | 92* | Reference |
| CoP$_2$/rGO | 1.0M KOH | 88 | 84* | Reference |
| NiCo$_2$S$_4$ nanowire array | 1.0M KOH | 210 | 7.4* | Reference |
| Electrodeposited CoP film | 1.0M KOH | 94 | 480* | Reference |
| NiCo$_2$O$_4$ | 1.0M KOH | 110 | 52* | Reference |
| EG/Co$_{0.85}$Se/NiFe—LDH | 1.0M KOH | 260 | 4.3* | Reference |
| NiFe LDH | 1.0M KOH | 210 | 8.2* | Reference |
| NiFe LDH@DG10 | 1.0M KOH | 66 | 60* | Reference |
| NiFe LDH/Cu NW | 1.0M KOH | 116 | 124* | Reference |
| NiFeO$_x$/CFP | 1.0M KOH | 88 | 62* | Reference |
| NiP/Ni | 1.0M KOH | 130 | 134* | Reference |

As seen in FIG. 9b, which provides the Tafel plots corresponding to FIG. 9a, the Tafel slope of the herein-disclosed FeP/Ni$_2$P catalyst is only 24.2 mV dec$^{-1}$, which is lower than that of Ni$_2$P (117.3 mV dec$^{-1}$) and Pt (36.8 mV dec$^{-1}$).

Figure 11A:
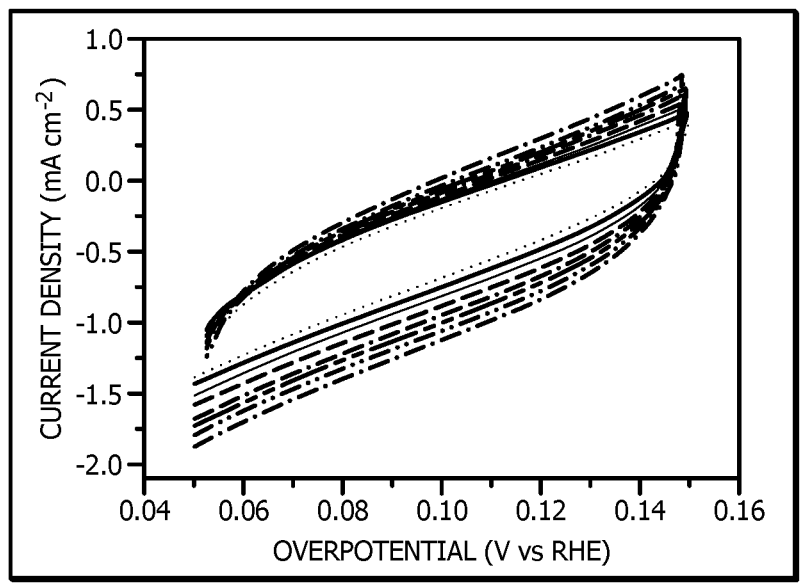
FIG. 11a provides the scan rate dependence of the current densities of $Ni_2P$/Ni foam, as HER catalyst with scan rates ranging from 1 mV $s^{-1}$ to 10 mV $s^{-1}$ at intervals of 1 mV $s^{-1}$.
Figure 11B:
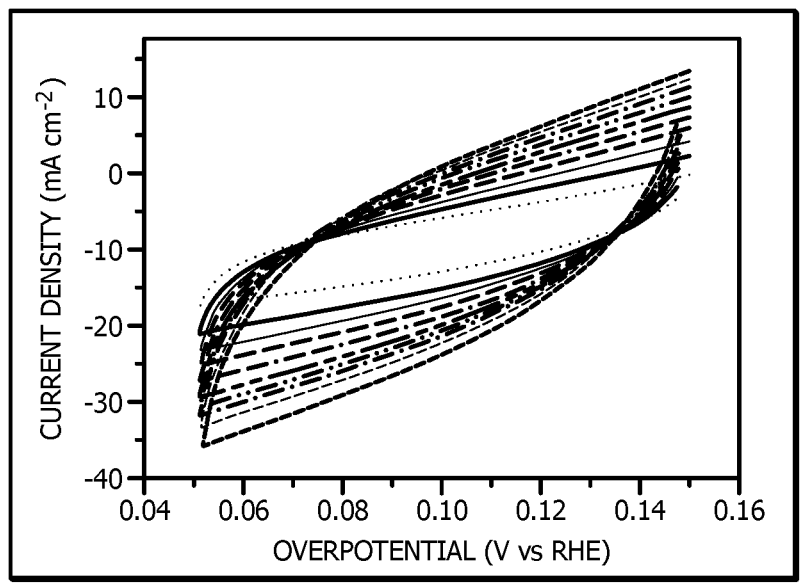
FIG. 11b provides the scan rate dependence of the current densities of FeP/$Ni_2P$, as HER catalyst with scan rates ranging from 1 mV $s^{-1}$ to 10 mV $s^{-1}$ at intervals of 1 mV $s^{-1}$.
Figure 12:
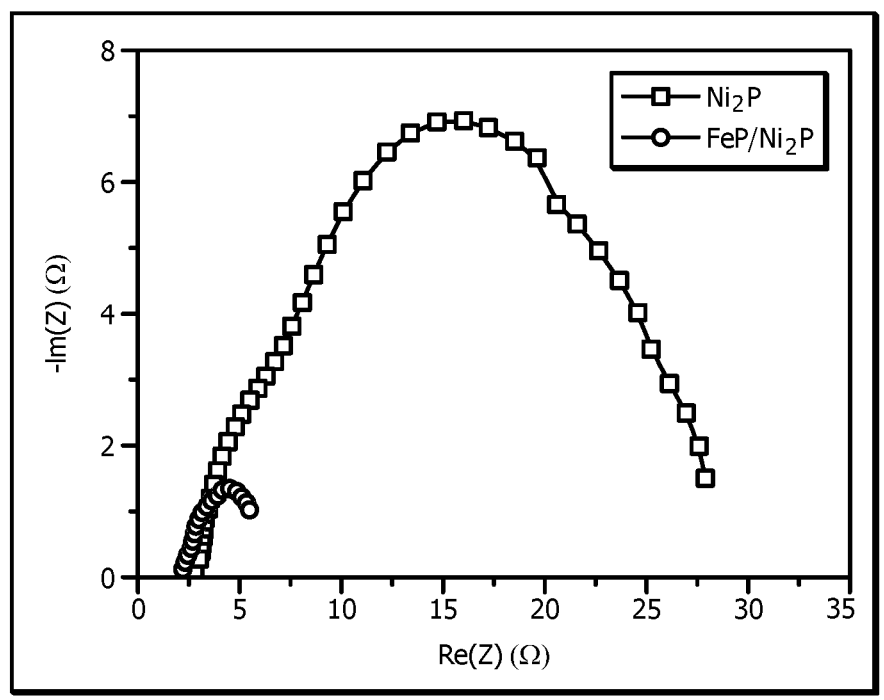
FIG. 12 provides Nyquist plots of $Ni_2P$ and FeP/$Ni_2P$ for HER measured at −150 mV vs. RHE.

FIG. 9c provides double-layer capacitance measurements for determining electrochemically active surface areas of Ni$_2$P* and FeP/Ni$_2$P electrodes. FIG. 11a and FIG. 11b provides the scan rate dependence of the current densities of Ni$_2$P/Ni foam and FeP/Ni$_2$P, respectively, as HER catalysts with scan rates ranging from 1 mV s$^{-1}$ to 10 mV s$^{-1}$ at intervals of 1 mV s$^{-1}$. FIG. 12 provides Nyquist plots of Ni$_2$P and FeP/Ni$_2$P for HER measured at −1.074 V vs. RHE. To gain further insight into the outstanding HER activity, the $C_{dl}$ values (FIG. 9c, FIG. 11) were utilized to compare the active surface area, confirming that both high active surface area (907.8 mF/cm$^2$) and small charge transfer resistance (FIG. 12) contribute greatly to the outstanding HER catalytic activity of the herein-disclosed FeP/Ni$_2$P hybrid. It is noted that the capacitance is different when the same FeP/Ni$_2$P catalyst was used for HER and OER, which is possibly due to the different origins of active sites for the OER and HER. In particular, we prepared pure Ni$_2$P* catalyst on Ni Calculation of Turn Over Frequency (TOF)

Figure 14:
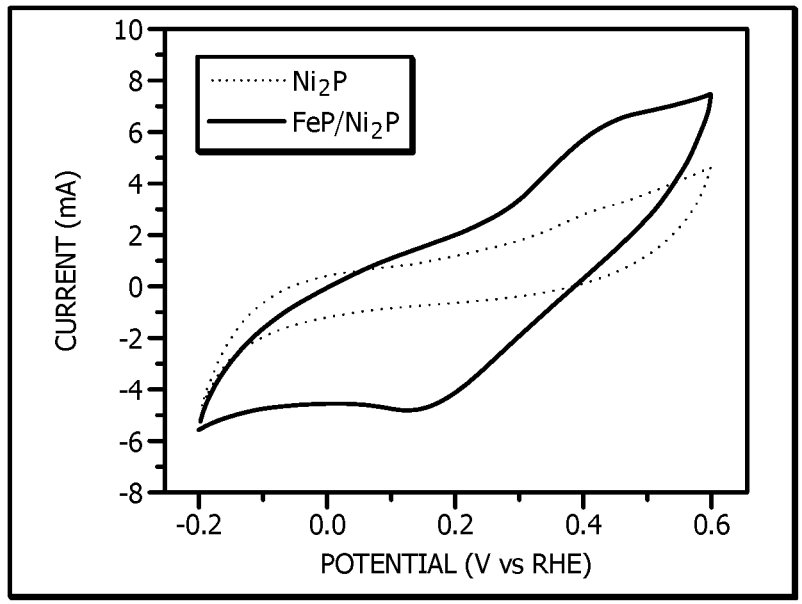
FIG. 14 provides the CV curves recorded on the FeP/$Ni_2P$ hybrid and pure $Ni_2P$* electrodes in the potential ranges between −0.2 V vs. RHE and 0.6 V vs. RHE in 1 M PBS.

The intrinsic catalytic activity was assessed by the turn-over frequency (TOF) for each active site quantified by an electrochemical method. Supposing that every active site was accessible to the electrolyte, the TOF values can be calculated by the following formula:

$$TOF = \frac{1}{2}\frac{I}{nF} \quad (1)$$

where these physical variables F, n, and I are corresponding to the Faraday constant (~96485 C/mol), the number of active sites (mol), and the current (A) during the LSV measurement in 1 M KOH, respectively. The factor ½ is due to fact that two electrons are required to form one hydrogen molecule from two protons. The number of active sites was determined by an electrochemical method. The CV curves were measured in 1M PBS electrolyte (pH=7). Due to the difficulty in assigning the observed peaks to a given redox couple, the number of active sites is nearly proportional to the integrated voltammetric charges (cathodic and anodic) over the CV curves. Supposing a one-electron process for both reduction and oxidation, we can get the upper limit of the number of active sites (n) based on the follow equation:

$$n = \frac{Q}{2F} \quad (2)$$

where F and Q are the Faraday constant and the whole charge of CV curve, respectively. By this equation and the CV curves, we can obtain the number of active sites for the FeP/Ni$_2$P hybrid is around $3.71 \times 10^{-7}$ mol, while this value is changed to $1.47 \times 10^{-7}$ mol for the pure Ni$_2$P catalyst, meaning that the FeP/Ni$_2$P hybrid has active sites 2.5 times that of just Ni$_2$P catalyst. FIG. 14 provides the CV curves recorded on the FeP/Ni$_2$P hybrid and pure Ni$_2$P electrodes in the potential ranges between −0.2 V vs. RHE and 0.6 V vs. RHE in 1 M PBS. The scan rate was 50 mV s$^{-1}$.

Thus, from the TOF method, the number of active catalytic sites for the FeP/Ni$_2$P hybrid was found to be around 2.5 times that of the Ni$_2$P* catalyst, and accordingly the TOF of the FeP/Ni$_2$P hybrid is calculated to be 0.163 s$^{-1}$ at 100 mV overpotential, which is much higher than that of pure Ni$_2$P* catalyst (0.006 s$^{-1}$) at the same overpotential.

Figure 9D:
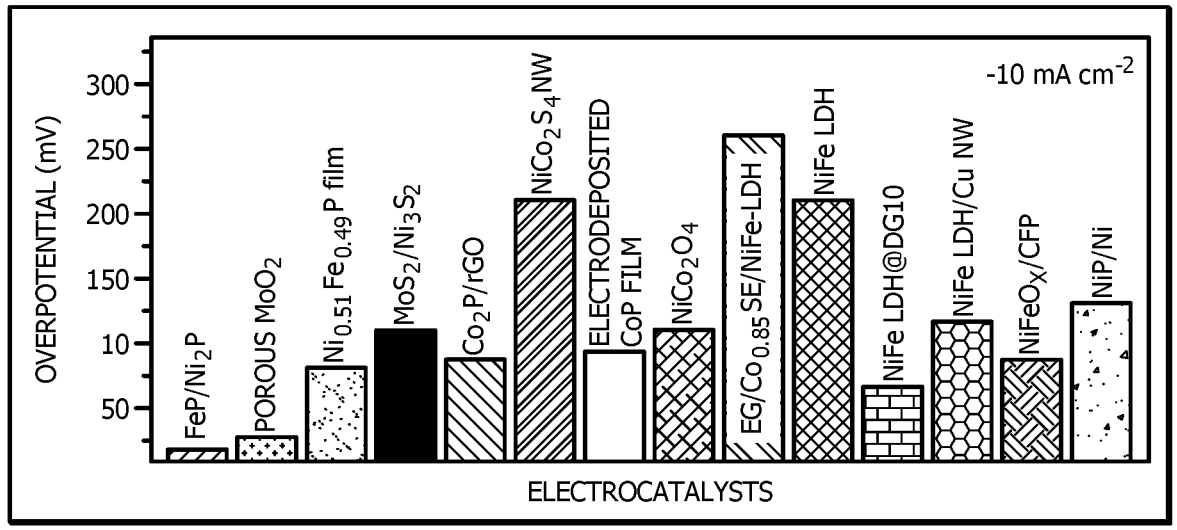
FIG. 9d provides a comparison of the overpotentials required at 10 mA $cm^{-2}$ between the herein-disclosed FeP/$Ni_2P$ catalyst of Example 3 and available reported HER catalysts.
Figure 9E:
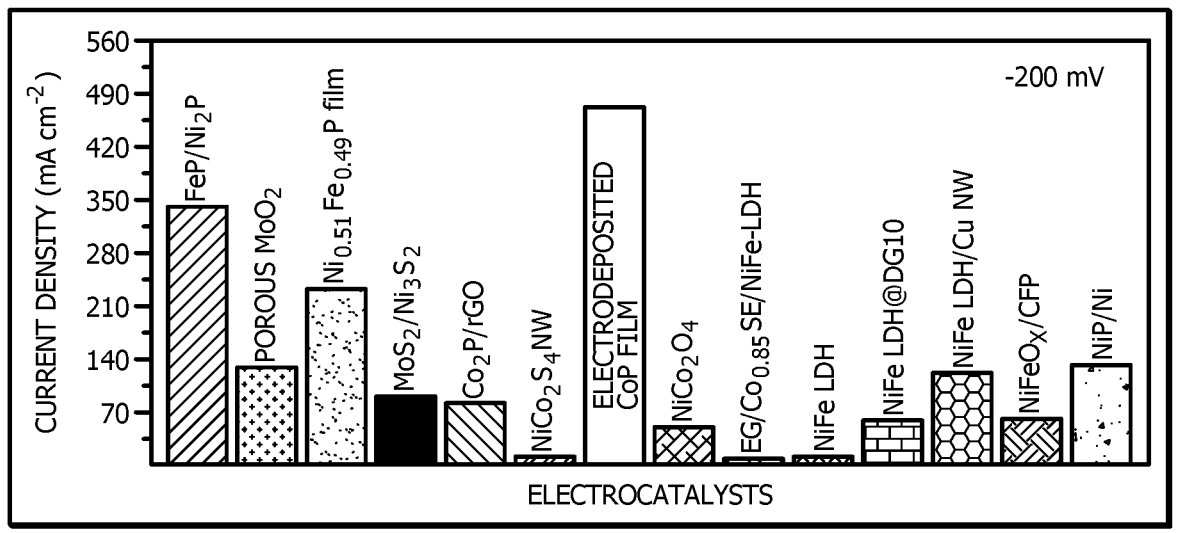
FIG. 9e provides a comparison of the current densities delivered at −200 mV between the herein-disclosed FeP/$Ni_2P$ catalyst of Example 3 and available reported HER catalysts.
Figure 9F:
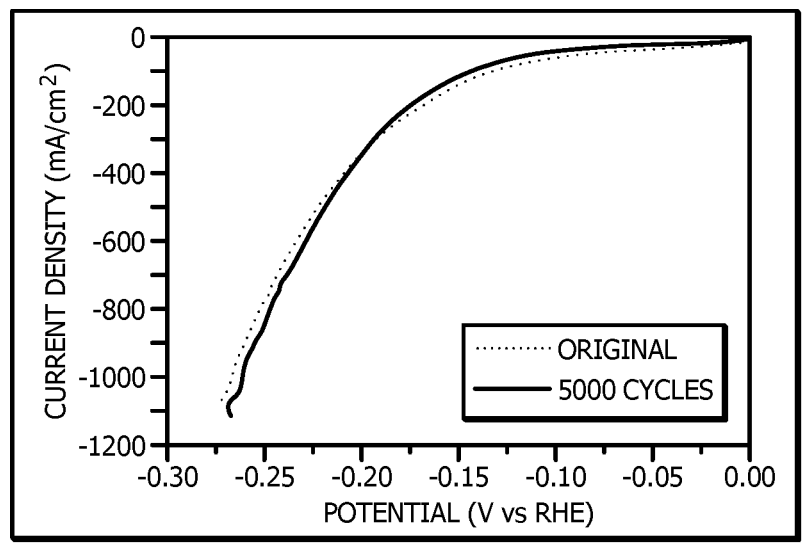
FIG. 9f provides polarization curves before and after the 5000 cycling test of Example 3.
Figure 9G:
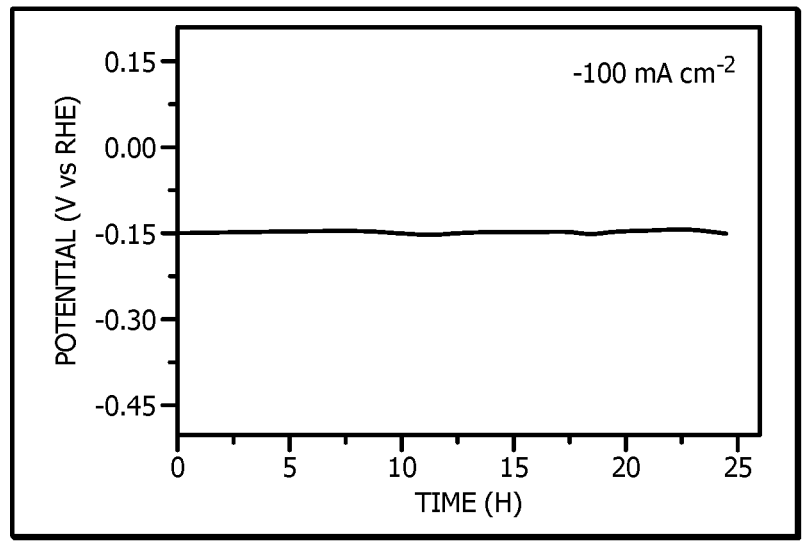
FIG. 9g provides the chronopotentiometric curve of the herein-disclosed FeP/$Ni_2P$ electrode of Example 3 tested at a constant current density of −100 mA $cm^{-2}$ for 24 h.
Figure 10:
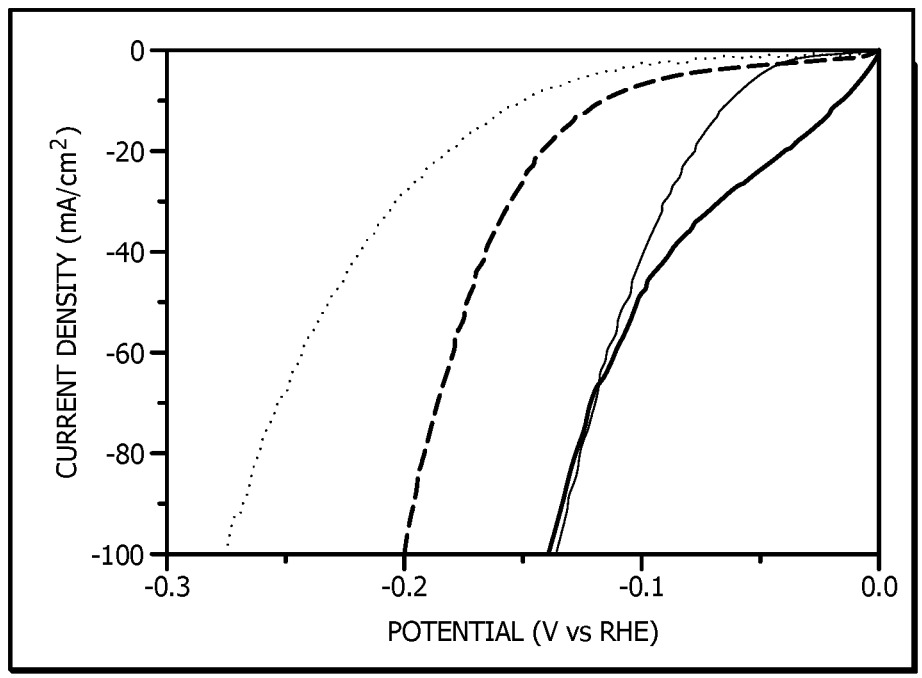
FIG. 10 shows enlarged polarization curves of different HER electrocatalysts of Example 3.
Figure 15C:
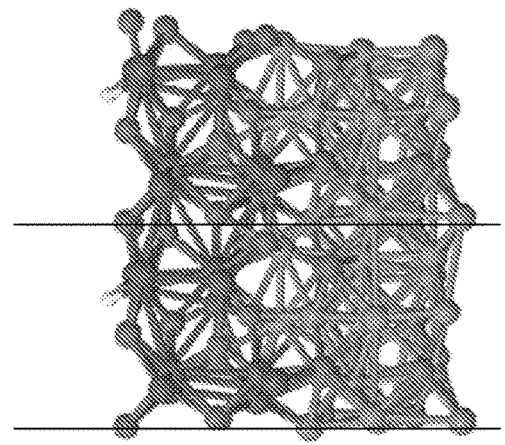
FIG. 15c provides the molecular structures of the systems calculated in Example 3: FeP(010)
Figure 15B:
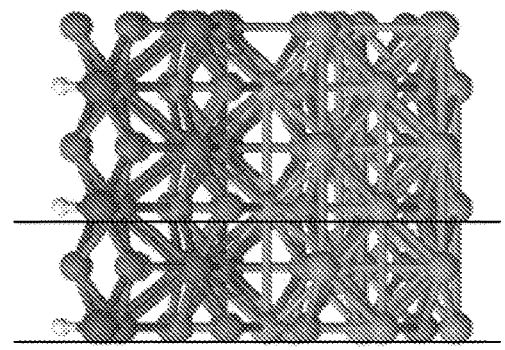
FIG. 15b provides the molecular structures of the systems calculated in Example 3: FeP(001)
Figure 15A:
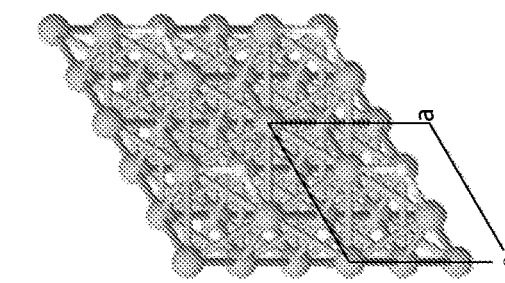
FIG. 15a provides the molecular structures of the systems calculated in Example 3: $Ni_2P$(100)
Figure 15F:
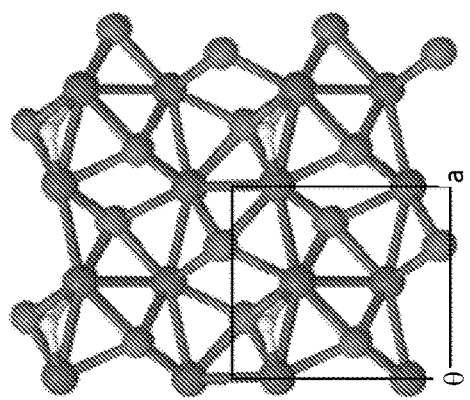
FIG. 15f provides the molecular structures of the systems calculated in Example 3: FeP(010) on $Ni_2P$(100), side view.
Figure 15E:
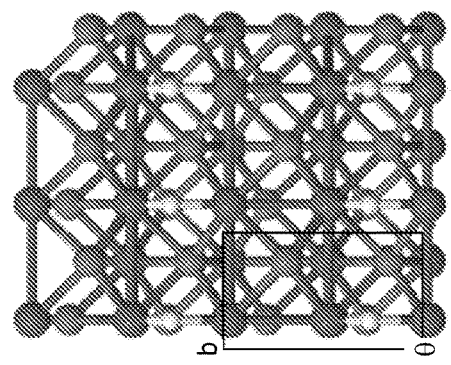
FIG. 15e provides the molecular structures of the systems calculated in Example 3: FeP(001) on $Ni_2P$(100), side view.
Figure 15D:
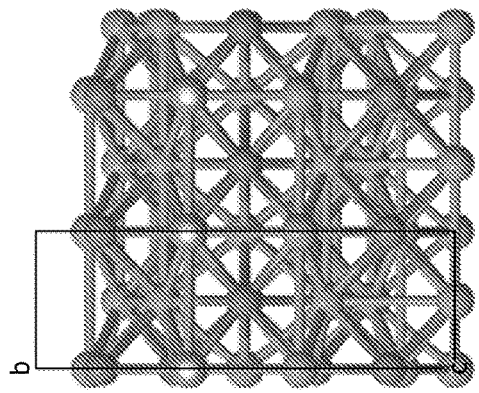
FIG. 15d provides the molecular structures of the systems calculated in Example 3: Pt(111)

FIG. 9d provides a comparison of the overpotentials required at 10 mA cm$^{-2}$ between the herein-disclosed FeP/Ni$_2$P catalyst and available reported HER catalysts. FIG. 9e provides a comparison of the current densities delivered at −200 mV between the herein-disclosed FeP/Ni$_2$P catalyst and available reported HER catalysts. As seen from FIG. 9d and FIG. 9e, the herein-disclosed FeP/Ni$_2$P hybrid showed outstanding HER activity compared to other available bifunctional catalysts. To evaluate its stability during electrochemical HER, a long-term cycling test and continuous operation for 24 h of hydrogen release at −100 mA/cm$^2$ were performed in 1 M KOH. FIG. 9f provides polarization curves before and after the 5000 cycling test, and FIG. 9g provides the chronopotentiometric curve of the herein-disclosed FeP/Ni$_2$P electrode tested at a constant current density of −100 mA cm$^{-2}$ for 24 h. As seen in FIG. 9f and FIG. 9g, the herein-disclosed FeP/Ni$_2$P electrode demonstrated good stability In order to determine the factors contributing to the superior HER activity of the herein-disclosed FeP/Ni$_2$P catalyst, density functional theory (DFT) calculations were performed on this catalyst. FIGS. 15a-15f provide the molecular structures of the systems calculated: FIG. 15a—Ni$_2$P(100); FIG. 15b—FeP(001); FIG. 15c—FeP(010); FIG. 15d—Pt(111) FIG. 15e—FeP(001) on Ni$_2$P(100), side view; and FIG. 15f—FeP(010) on Ni$_2$P(100), side view. According to FIG. 1d, (021) and (010) lattice planes are observed on Ni$_2$P nanoparticles. Since (021) and (010) of Ni$_2$P have a simple common perpendicular direction (100), this plane was chosen to model Ni$_2$P (FIGS. 15a-15f). Conversely, the two directions, (220) and (103) on FeP, do not share a common simple perpendicular direction, hence two different directions, (001) and (010), were chosen to model FeP. Since the overall system involved two materials, the interactions between FeP and Ni$_2$P were modeled by placing FeP on top of Ni$_2$P, which is reasonable since a Ni foam was used as the material on which Ni$_2$P and FeP were grown. The corresponding lattice distances were chosen to minimize the percent changes in both Ni$_2$P and FeP. The hydrogen adsorption energy, $\Delta G_H$, was calculated by density functional theory (DFT) in a GGA level and is shown in Table 3.

TABLE 3

| | Calculated $\Delta G_H$ in eV | |
|---|---|---|
| $\Delta G_H$ (eV) | Acidic condition (pH = 0) | Basic condition (pH = 14) |
| Ni$_2$P(100) | 0.399 | 0.306 |
| FeP(001) | −0.059 | −0.057 |
| FeP(010) | −0.221 | −0.237 |
| FeP(001)/Ni$_2$P | −0.279 | −0.255 |
| FeP(010)/Ni$_2$P | −0.238 | −0.230 |
| Pt | −0.184 | −0.135 |

Figure 9H:
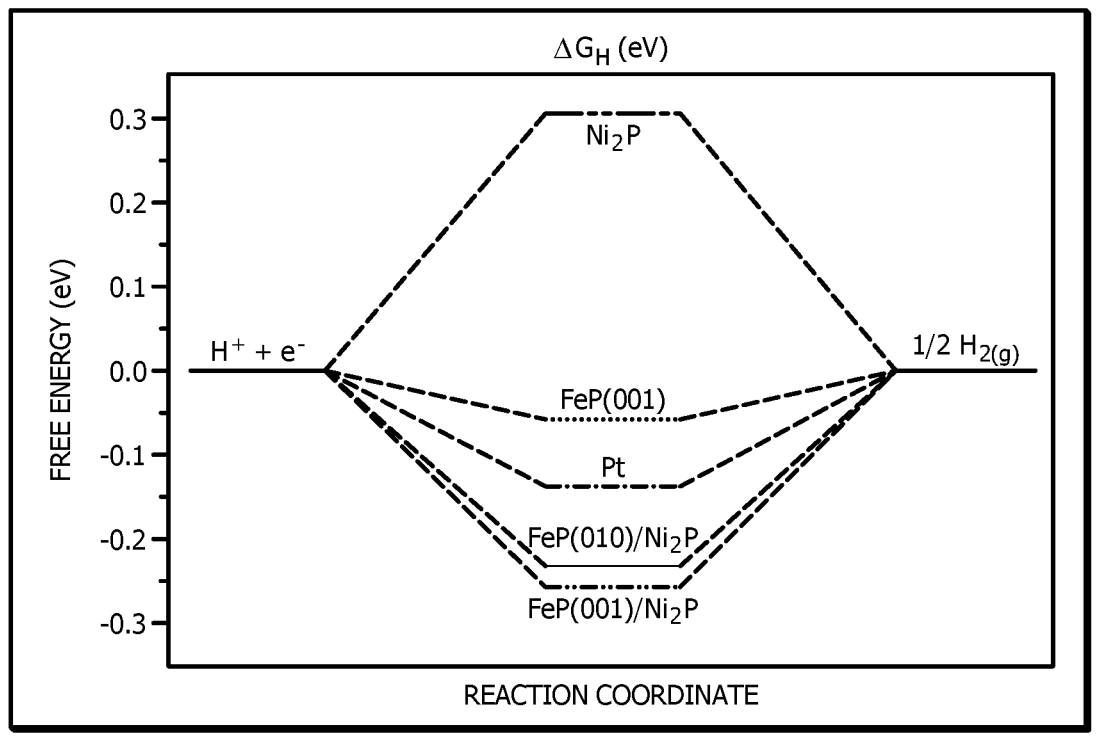
FIG. 9h provides the free energy diagram for $\Delta G_H$, the hydrogen adsorption free energy at pH=14 on the herein-disclosed FeP/$Ni_2P$ catalyst of Example 3 in comparison with $Ni_2P$ and benchmark Pt catalysts.

FIG. 9h provides the free energy diagram for $\Delta G_H$, the hydrogen adsorption free energy at pH=14 on the herein-disclosed FeP/Ni$_2$P catalyst in comparison with Ni$_2$P and benchmark Pt catalysts. As shown in FIG. 9h, FIGS. 15a-15f, and Table 3, pure Ni$_2$P (001) leads to a relatively strong exothermic $\Delta G_H$ (0.306 eV), indicating that it is not the most active center for the hydrogen evolution electrocatalysis, which was confirmed experimentally (FIG. 9a, FIG. 9b, FIG. 13). However, this hydrogen adsorption energy |$\Delta G_H$| is reduced significantly to 0.255 and 0.230 eV for a very thin FeP (100) or FeP (010) crystal (~3 layers), respectively, hybridized atop with Ni$_2$P. Calculation was confined to a thin layer of FeP crystal, ignoring the particulate size (5-30 nm), so it was hypothesized that the as-synthesized FeP nanoparticles along with Ni$_2$P preferentially expose the most active facets as those of bulk FeP (001) crystal, which results in further reduction of |$\Delta G_H$| to only 0.06 eV, contributing to the high activity not seen in typical FeP crystals. This conclusion is also supported by the above experiments regarding the TOF calculation. Thus, both the experiment and theory support that the herein-disclosed hybrid catalyst is an efficient HER electrocatalyst.

Example 4: Overall Water Splitting

Figure 16A:
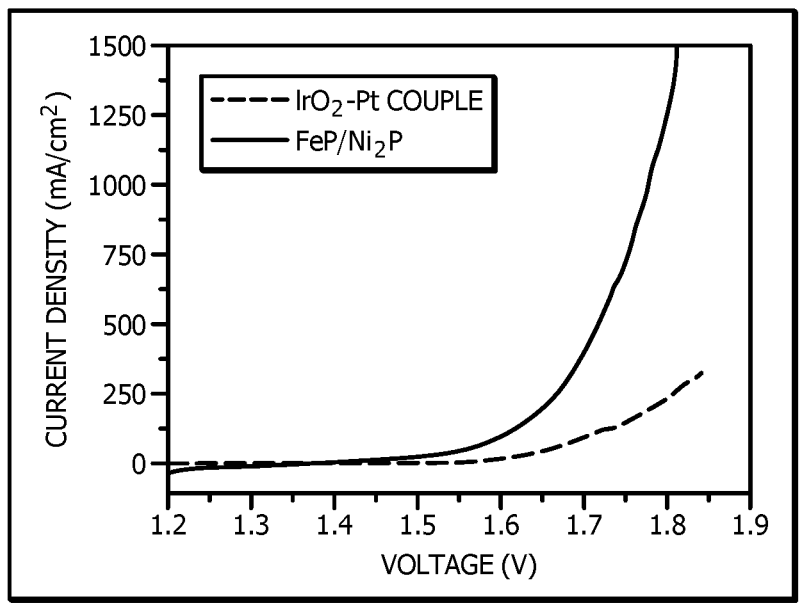
FIG. 16a provides the polarization curves of FeP/Ni$_2$P and IrO$_2$—Pt coupled catalysts in a two-electrode configuration.
Figure 16B:
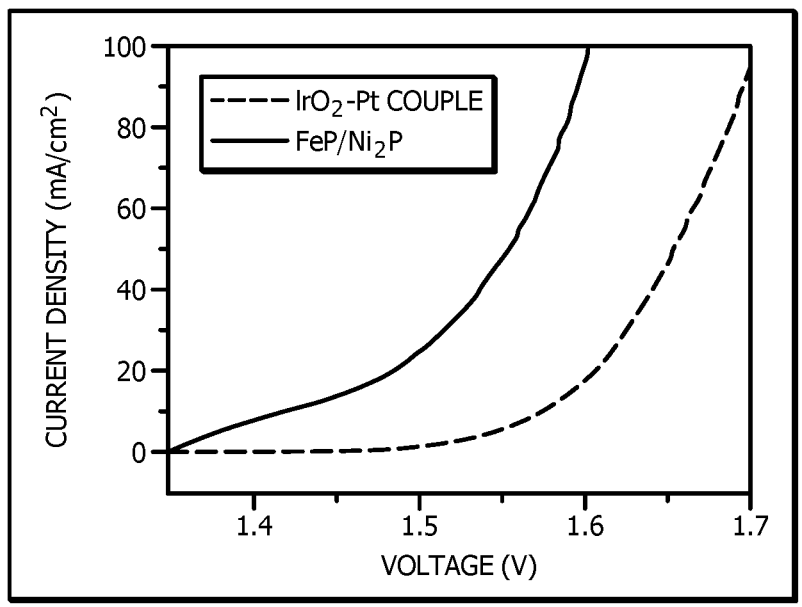
Figure 16C:
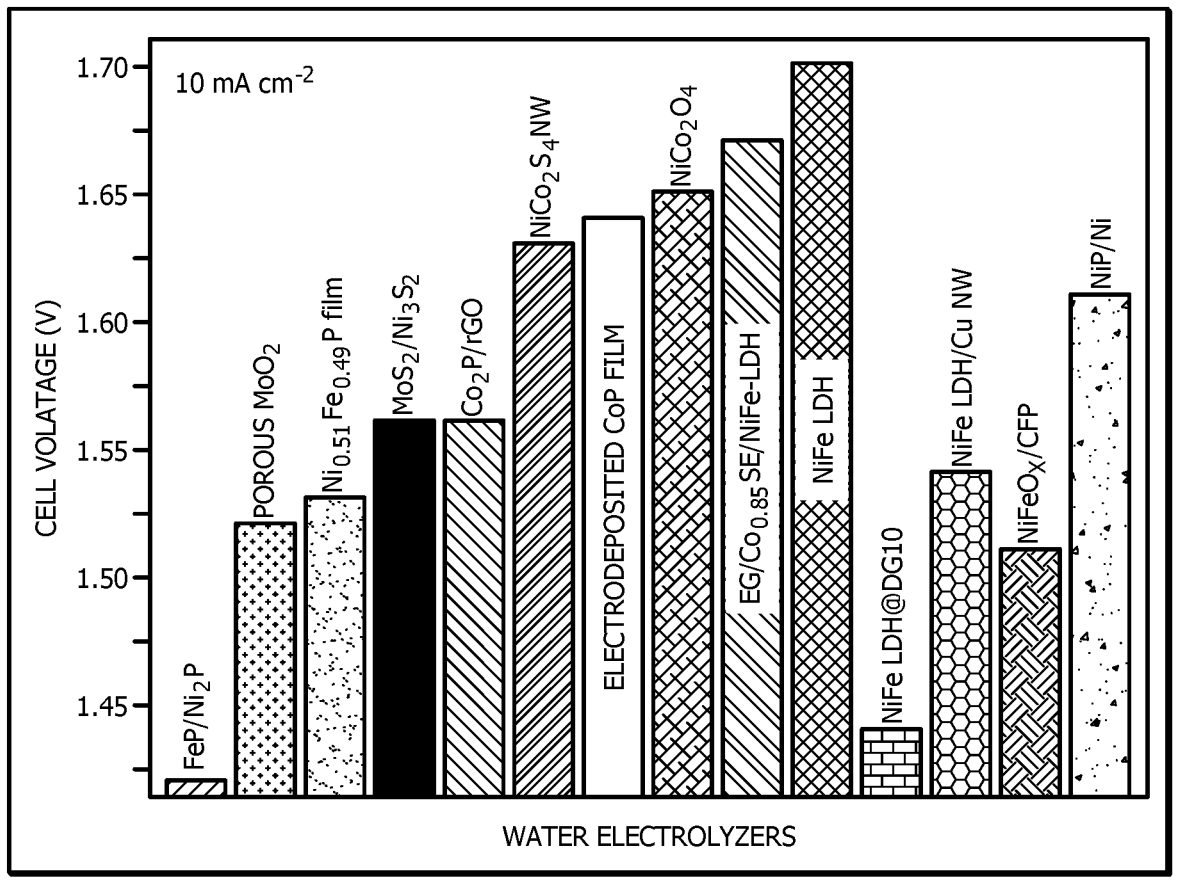
FIG. 16c provides a comparison of the cell voltages to achieve 10 mA cm$^{-2}$ among different water alkaline electrolyzers.
Figure 17:
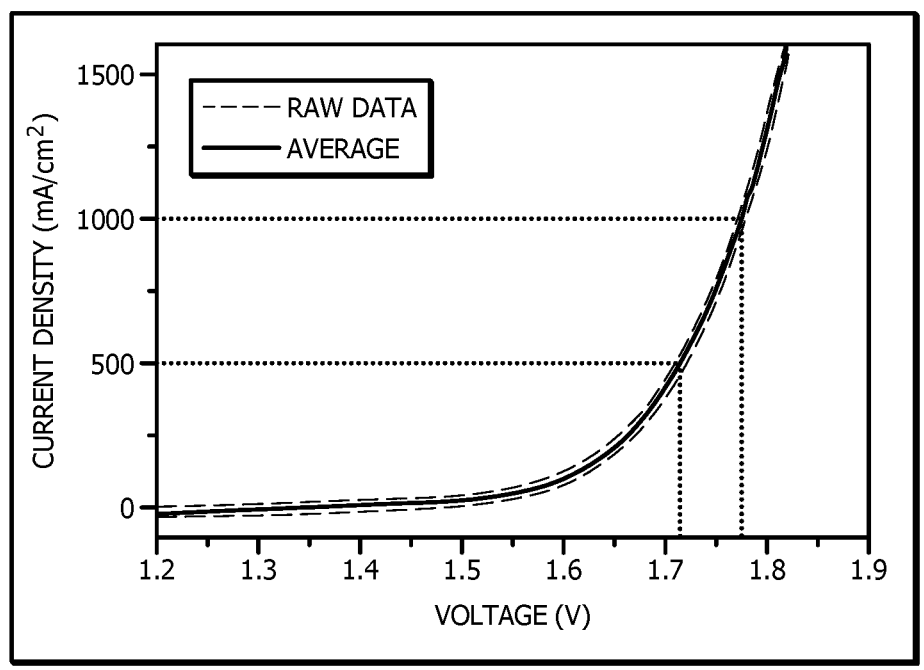

Given the outstanding OER and HER activities provided by the herein-disclosed FeP/Ni$_2$P hybrid electrocatalyst in 1 M KOH electrolyte, the FeP/Ni$_2$P hybrid was utilized as both anode and cathode in a two-electrode configuration for overall water splitting in the same electrolyte. FIG. 16a provides the polarization curve of FeP/Ni$_2$P and IrO$_2$—Pt coupled catalysts in a two-electrode configuration; FIG. 16b provides an enlarged version at low current density region of FIG. 16a. FIG. 16c provides a comparison of the cell voltages to achieve 10 mA cm$^{-2}$ among different water alkaline electrolyzers. FIG. 17 provides a cyclic voltammetry (CV) curve (raw data) and corresponding average activity calculated from the CV curve of FeP/Ni$_2$P as a bifunctional catalyst for overall water splitting obtained at a scan rate: 1 mV s$^{-1}$. As seen in FIG. 16a and FIG. 16b, the cell voltage to afford a current density of 10 mA/cm$^2$ was as low as 1.42 V, substantially lower than that of the coupled benchmark IrO$_2$—Pt catalysts (1.57 V), and superior to most previously reported bifunctional electrocatalysts, which generally need cell voltages higher than 1.50 V to deliver the same current density, as seen in FIG. 16c, Table 4 below, and FIG. 17). This cell voltage also manifests that the electrical-to-fuel efficiency of water-splitting electrolyzers at 10 mA/cm$^2$ is dramatically elevated to 86.6% using solely this material, potentially positioning it with great potential for scale-up water electrolysis with high efficiency and low cost.

Table 4 provides a comparison of the HER, OER and overall water splitting activities with available robust bifunctional catalysts. In Table 4, $\eta_{10,HER}$, $\eta_{10,OER}$, $\eta_{10,overall}$, $\eta_{100,overall}$ and $j_{1.7,overall}$ correspond to the overpotentials of HER, OER catalyzed at 10 mA cm$^{-2}$, the cell voltages at 10 and 100 mA cm$^{-2}$, and current density at 1.7 V for the overall water splitting, respectively.

to afford 500 mA/cm$^2$ while also exhibiting excellent stability for more than 40 h confirmed by steady chronopotentiometric testing.

TABLE 4

Comparison of the HER, OER and Overall Water Splitting Activities with Available Robust Bifunctional Catalysts.

| Catalyst | Electrolytes | $\eta_{10, HER}$ (mV) | $\eta_{10, OER}$ (mV) | $\eta_{10, overall}$ (V) | $\eta_{100, overall}$ (V) | $j_{1.7, overall}$ (mA cm$^{-2}$) | Source |
|---|---|---|---|---|---|---|---|
| FeP/Ni$_2$P | 1.0M KOH | 14 | 154 | 1.42 | 1.602 | 406 | Herein-Disclosed |
| Porous MoO$_2$ | 1.0M KOH | 27 | 260 | 1.52 | 1.8* | 67* | Reference |
| Ni$_{0.51}$Fe$_{0.49}$P film | 1.0M KOH | 82 | 239 | 1.53 | 1.71* | 87* | Reference |
| MoS$_2$/Ni$_3$S$_2$ | 1.0M KOH | 110 | 218 | 1.56 | 1.71 | 91.4 | Reference |
| CoP$_2$/rGO | 1.0M KOH | 88 | 300 | 1.56 | 1.912* | 31* | Reference |
| NiCo$_2$S$_4$ nanowire array | 1.0M KOH | 210 | 260 | 1.63 | 2.097* | 16* | Reference |
| Electrodeposited Co—P film | 1.0M KOH | 94 | 345 | 1.64* | 1.745* | 42* | Reference |
| NiCo$_2$O$_4$ | 1.0M NaOH | 110 | 290 | 1.65 | 1.842* | 16* | Reference |
| EG/Co0.85Se/NiFe-LDH | 1.0M KOH | 260 | >250* | 1.67 | 1.907* | 16.6* | Reference |
| NiFe LDH | 1.0M NaOH | 210 | 240 | 1.7 | 2.241* | 10 | Reference |
| NiFe LDH@DG10 | 1.0M KOH | 66 | 201 | 1.44* | 1.87* | 60* | Reference |
| NiFe LDH/Cu NW | 1.0M KOH | 116 | 199 | 1.54 | 1.69* | 111* | Reference |
| NiFeO$_x$/CFP | 1.0M KOH | 88 | 230 | 1.51 | 1.73* | 70* | Reference |
| NiP/Ni | 1.0M KOH | 130 | 247 | 1.61 | 2.102* | 24* | Reference |

*Calculated according to the curves given in the literature.

Figure 16D:
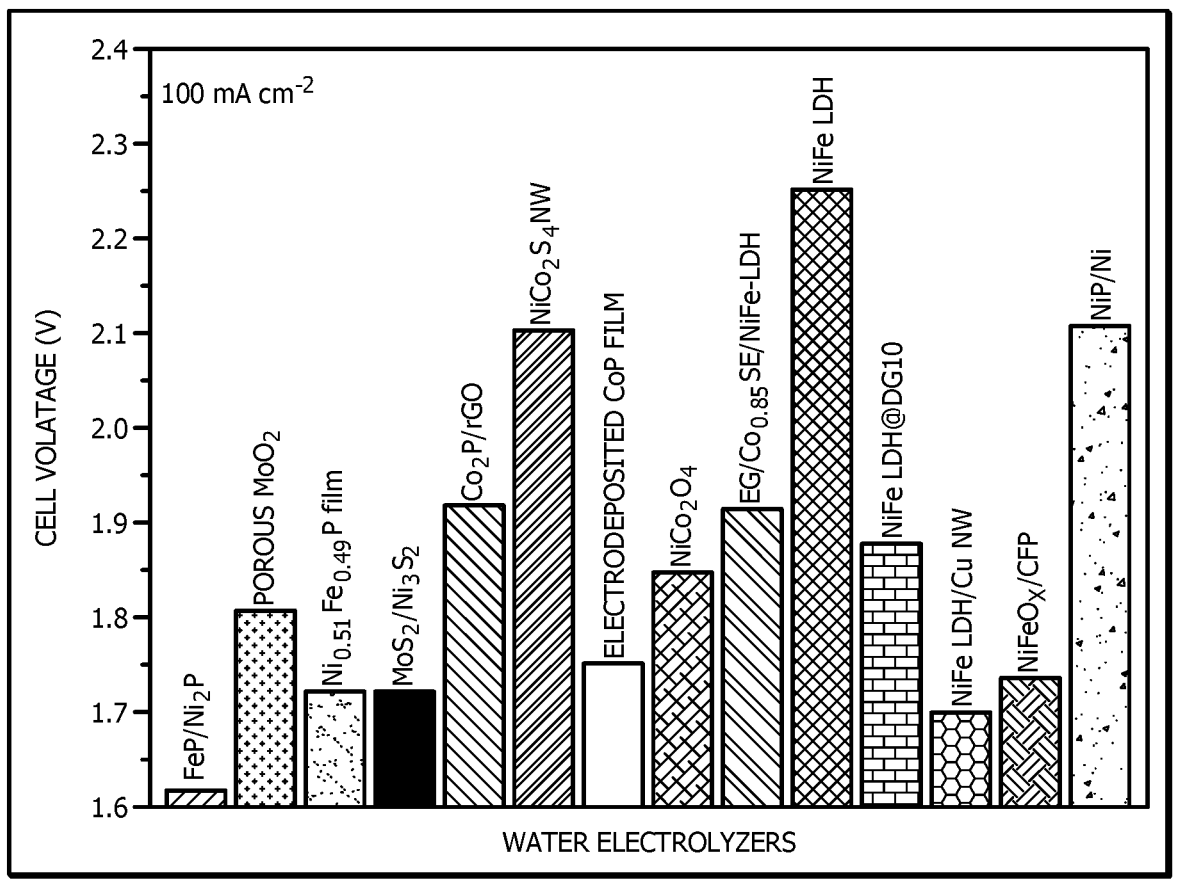
FIG. 16d provides a comparison of the cell voltages to achieve 100 mA cm$^{-2}$ among different water alkaline electrolyzers.
Figure 16E:
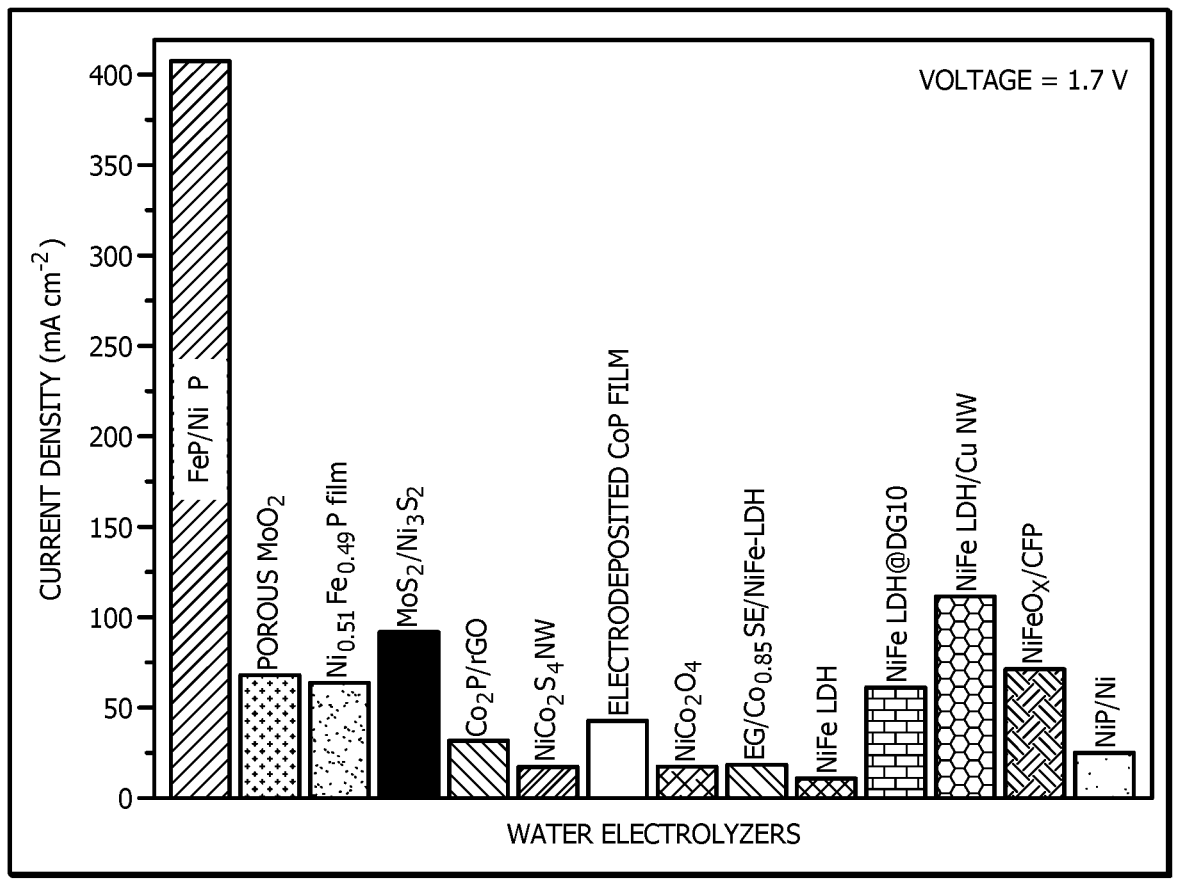
FIG. 16e provides a comparison of the current densities at 1.7 V for the herein-disclosed FeP/Ni$_2$P catalyst of Example 4 with available non-noble bifunctional catalysts.
Figure 16F:
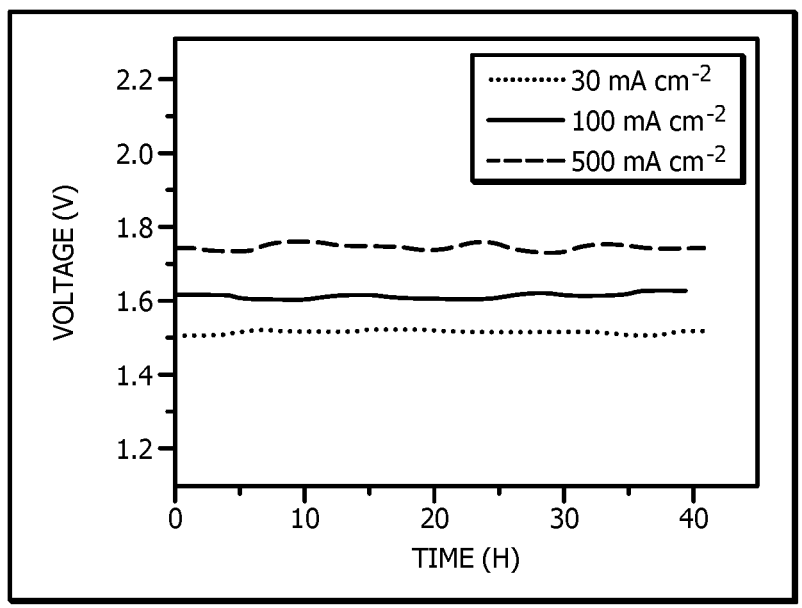
FIG. 16f provides the catalytic stability of the FeP/Ni$_2$P catalysts of Example 4 at 30, 100, and 500 mA cm$^{-2}$ for approximately 40 hours.

Although the best bifunctional NiFe LDH catalyst reported recently can deliver 20 mA/cm$^2$ at a cell voltage of 1.50 V, which is close to that of the herein-disclosed FeP/Ni$_2$P catalyst (1.48 V), a much larger cell voltage of 1.70 V is needed to achieve only 60 mA/cm$^2$, meaning low energy conversion efficiency at high current density. FIG. 16d provides a comparison of the cell voltages to achieve 100 mA cm$^{-2}$ among different water alkaline electrolyzers. FIG. 16e provides a comparison of the current densities at 1.7 V for the herein-disclosed FeP/Ni$_2$P catalyst with available non-noble bifunctional catalysts. As seen in FIG. 16d, nearly all conventional bifunctional electrocatalysts require a cell voltage greater than 1.69 V to reach 100 mA/cm$^2$ for the overall water splitting. As seen in FIG. 16e, even at 1.7 V cell voltage, most of the known electrolyzers can only deliver current densities below 110 mA/cm$^2$. In contrast, the herein-disclosed FeP/Ni$_2$P hybrid catalyst can readily drive water electrolysis at high current densities of 100, 500, and 1000 mA/cm$^2$ at very low cell voltages of 1.60, 1.72, and 1.78 V, respectively, showing that the herein-disclosed FeP/Ni$_2$P hybrid electrocatalyst performs outstandingly over the full range of current density. FIG. 16f provides the catalytic stability of the FeP/Ni$_2$P catalysts at 30, 100, and 500 mA cm$^{-2}$ for around 40 h. As seen in FIG. 16f, the long-term stability of the herein-disclosed FeP/Ni$_2$P electrode was tested at 30 and 100 mA/cm$^2$ for 36 h, showing no detectable voltage decay. Moreover, extremely high-current operation of the herein-disclosed electrolyzer at 1.72 V was examined for overall water splitting at 500 mA/cm$^2$, which is a big step toward real industrial applications. In comparison, commercial alkaline water electrolysis requires 1.8-2.4 V to generate 200-400 mA/cm$^2$, with no previously-known bifunctional catalysts showing catalytic activities superior to the commercial ones with good durability at high current density above 200 mA/cm$^2$. In contrast, as seen in FIG. 16f, the herein-disclosed alkaline electrolyzer required only 1.72 V Example 4a: Measurements of Gas Products from Overall Water Splitting by Gas Chromatography (GC)

Figure 18A:
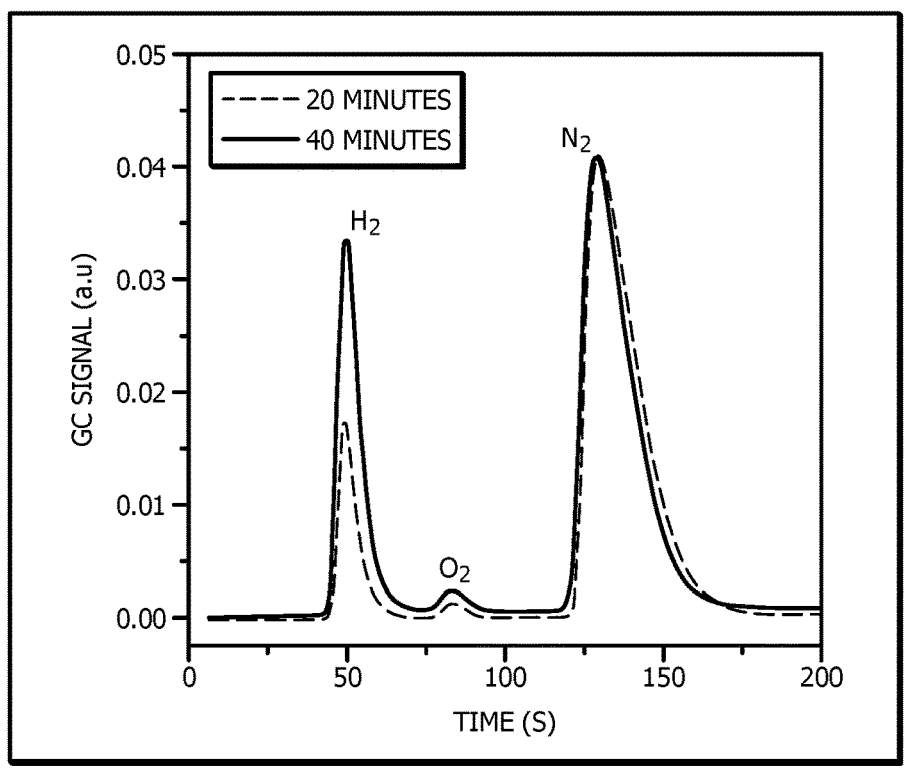
Figure 18B:
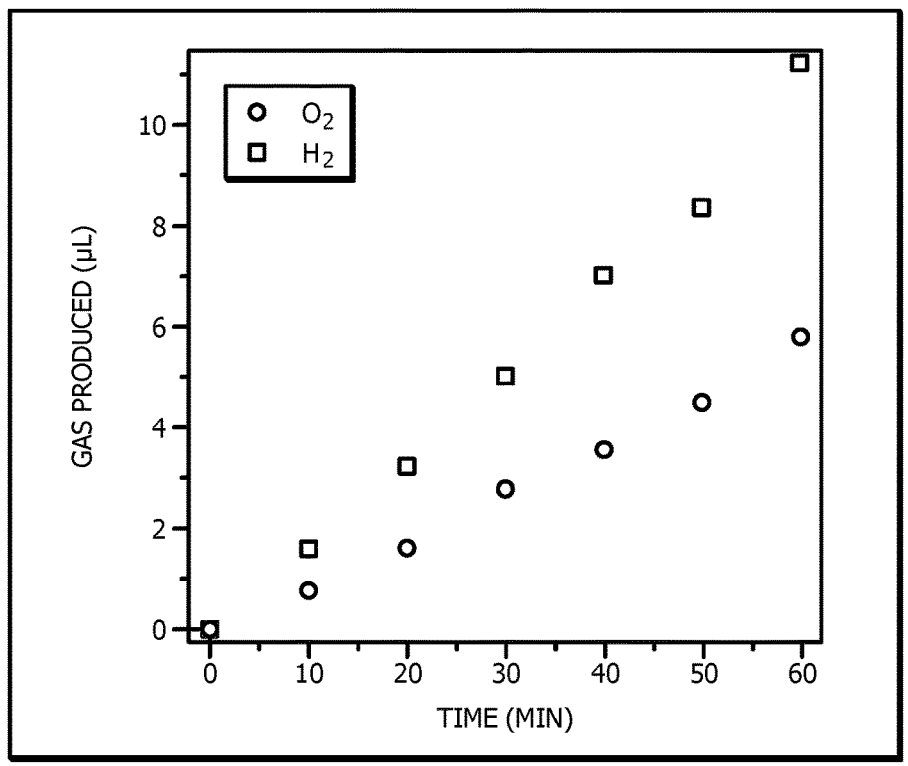

FIG. 18a shows GC signals for the FeP/Ni$_2$P-based water alkaline electrolyzer after 20 and 40 min of overall water splitting. FIG. 18b shows the amounts of H$_2$ and O$_2$ gases versus time at a constant current density of 100 mA cm$^{-2}$. Specifically, as seen in FIG. 18a and FIG. 18b, using the gas chromatography-based technique, it was discovered that H$_2$ and O$_2$ are the only gas products during water electrolysis, and the molar ratio between H$_2$ and O$_2$ is close to stoichiometric ratio of 2:1, suggesting that nearly all the electrons are actively involved in the catalytic reaction. This demonstrates outstanding overall-water-splitting activity of the herein-disclosed FeP/Ni$_2$P hybrid catalyst, offering great potential for industrial use.

While various embodiments have been shown and described, modifications thereof can be made by one skilled in the art without departing from the spirit and teachings of the disclosure. The embodiments described herein are exemplary only, and are not intended to be limiting. Many variations and modifications of the subject matter disclosed herein are possible and are within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, R$_L$ and an upper limit, R$_U$ is disclosed, any number falling within the range is specifically disclosed. In particular, the following numbers within the range are specifically disclosed: R=R$_L$+k*(R$_U$-R$_L$), wherein k is a variable ranging from 1 percent to 100 percent with a 1 percent increment, i.e., k is 1 percent, 2 percent, 3 percent, 4 percent, 5 percent, . . . 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim is intended to mean that the subject element is required, or alternatively, is not required. Both alternatives are intended to be within the scope of the claim. Use of broader terms such as comprises, includes, having, etc. should be understood to provide support for narrower terms such as consisting of, consisting essentially of, comprised substantially of, etc.

Accordingly, the scope of protection is not limited by the description set out above but is only limited by the claims which follow, that scope including all equivalents of the subject matter of the claims. Each and every claim is incorporated into the specification as an embodiment of the present disclosure. Thus, the claims are a further description and are an addition to the embodiments of the present disclosure. The discussion of a reference is not an admission that it is prior art to the present disclosure, especially any reference that may have a publication date after the priority date of this application. The disclosures of all patents, patent applications, and publications cited herein are hereby incorporated by reference, to the extent that they provide exemplary, procedural, or other details supplementary to those set forth herein.

ADDITIONAL DESCRIPTION

The particular embodiments disclosed above are illustrative only, as the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present disclosure. Alternative embodiments that result from combining, integrating, and/or omitting features of the embodiment(s) are also within the scope of the disclosure. While compositions and methods are described in broader terms of "having", "comprising," "containing," or "including" various components or steps, the compositions and methods can also "consist essentially of" or "consist of" the various components and steps. Use of the term "optionally" with respect to any element of a claim means that the element is required, or alternatively, the element is not required, both alternatives being within the scope of the claim.

Numbers and ranges disclosed above may vary by some amount. Whenever a numerical range with a lower limit and an upper limit is disclosed, any number and any included range falling within the range are specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an", as used in the claims, are defined herein to mean one or more than one of the element that it introduces. If there is any conflict in the usages of a word or term in this specification and one or more patent or other documents, the definitions that are consistent with this specification should be adopted.

Embodiments disclosed herein include:

A: A method of manufacturing a bifunctional electrocatalyst for overall water splitting comprising oxygen evolution reaction (OER) and hydrogen evolution reaction (HER), the method comprising: growing electrocatalyst comprising primarily metallic phosphides on a three-dimensional substrate by: immersing the substrate in an iron nitrate solution to form a once disposed substrate; subjecting the once disposed substrate to thermal phosphidation with phosphorus powder under inert gas to grow metal phosphides thereupon and form a once subjected substrate; cooling the once subjected substrate to form a cooled, once subjected substrate; immersing the cooled, once subjected substrate in an iron nitrate solution to form a twice disposed substrate; and subjecting the twice disposed substrate to thermal phosphidation with phosphorus powder under inert gas to provide an electrode comprising the bifunctional electrocatalyst on the three-dimensional substrate.

B: An electrode for overall water splitting, the electrode comprising: a substrate; and a bifunctional electrocatalyst comprising primarily metallic phosphides on a surface of the substrate.

C: A method of electrocatalytic water splitting, the method comprising: providing an anode and a cathode, wherein each of the anode and the cathode comprises a uniform distribution of a bifunctional electrocatalyst comprising metallic phosphides on a conductive substrate; and utilizing the anode and the cathode for alkaline water electrolysis, wherein the bifunctional electrocatalyst promotes hydrogen evolution reaction (HER) at the cathode, and oxygen evolution reaction (OER) at the anode.

Each of embodiments A, B and C may have one or more of the following additional elements: Element 1: wherein the metallic phosphides comprise primarily a majority of iron phosphide (FeP) and a minority of dinickel phosphide ($Ni_2P$). Element 2: wherein the metallic phosphides less than or equal to about 12.5% weight percent dinickel phosphide ($Ni_2P$) and greater than or equal to about 87.5% weight percent iron phosphide (FeP). Element 3: wherein thermal phosphidation is effected at a temperature in the range of from about 350° C. to about 550° C. Element 4: wherein subjecting the once disposed substrate to thermal phosphidation, subjecting the twice disposed substrate to thermal phosphidation, or both comprises a thermal phosphidation for a duration of time in the range of from about 0.5 hour to about 1 hours. Element 5: wherein the three-dimensional substrate comprises nickel (Ni) foam, wherein the metallic phosphides of the bifunctional electrocatalyst comprise FeP and $Ni_2P$, and wherein the electrode comprises or consists essentially of an FeP/$Ni_2P$/Ni foam. Element 6: wherein the three-dimensional substrate comprises one or more of a metallic foam or a carbon cloth paper. Element 7: wherein the metallic foam comprises nickel (Ni), copper (Cu), iron (Fe), cobalt (Co), titanium (Ti), or a combination thereof. Element 8: wherein the inert gas comprises argon, and wherein the phosphorus comprises red phosphorus. Element 9: wherein subjecting to thermal phosphidation comprises direct thermal phosphidation in a tube furnace or a chemical vapor deposition (CVD) system or molecular organic chemical vapor deposition (MOCVD) system under argon atmosphere. Element 10: wherein the electrocatalyst has a high porosity, as evidenced by a porosity of the metallic phosphides on the substrate that is greater than or equal to a porosity of the substrate. Element 11: wherein the electrocatalyst is operable for alkaline water electrolysis. Element 12: wherein the bifunctional electrocatalyst exhibits good performance for both the HER and the OER, and is stable at current densities of up to at least 100 mA/$cm^2$.

Element 13: wherein the substrate comprises a three dimensional substrate. Element 14: wherein the metal foam comprises nickel (Ni), copper (Cu), iron (Fe), cobalt (Co), titanium (Ti), or a combination thereof. Element 15: wherein the three dimensional substrate comprises nickel (Ni) foam, wherein the metallic phosphides comprise primarily a combination of iron phosphide (FeP) and dinickel phosphide ($Ni_2P$), and wherein the electrode thus comprises or consists essentially of FeP and $Ni_2P$ on Ni foam. Element 16: wherein the metallic phosphides comprise primarily iron phosphide (FeP) and dinickel phosphide ($Ni_2P$). Element 17: wherein the metallic phosphides comprise a majority of iron phosphide (FeP) and a minority of dinickel phosphide ($Ni_2P$). Element 18: wherein a loading of the bifunctional electrocatalyst comprising primarily metallic phosphides is in the range of from about 8 to about 13.5 $mg/cm^2$. Element 19: wherein a loading of dinickel phosphide ($Ni_2P$) is in the range of from about 1 to about 2 $mg/cm^2$; wherein a loading of iron phosphide (FeP) is in the range of from about 7 to about 13 $mg/cm^2$, or a combination thereof. Element 20: wherein the bifunctional electrocatalyst has a high porosity, as evidenced by a porosity of the FeP/$Ni_2P$ on the substrate that is greater than or equal to a porosity of the substrate.

Element 21: wherein the bifunctional catalyst of the anode has the same composition as the bifunctional catalyst of the cathode. Element 22: wherein a loading of the metallic phosphides on the conductive substrate is in the range of from about 8 to about 15 $mg/cm^2$. Element 23: wherein a loading of dinickel phosphide ($Ni_2P$) on the conductive substrate is in the range of from about 1 to about 2 $mg/cm^2$; wherein a loading of iron phosphide (FeP) on the conductive substrate is in the range of from about 7 to about 13 $mg/cm^2$; or a combination thereof. Element 24: wherein the conductive substrate comprises nickel foam, and wherein the anode and the cathode thus comprise an FeP/$Ni_2P$/Ni foam. Element 25: wherein, when operated in 1M alkaline solution, the bifunctional electrocatalyst requires a low overpotential of less than 15 mV and 155 mV, respectively, to deliver a current density of 10 $mA/cm^2$ for the HER and OER, leading to an overall water-splitting activity at 10 $mA/cm^2$ with less than 1.5 V. Element 26: wherein the bifunctional electrocatalyst has a high porosity, as evidenced by a porosity of the bifunctional electrocatalyst on the conductive substrate that is greater than a porosity of the conductive substrate. Element 27: wherein, when operated in 1M alkaline solution, the bifunctional electrocatalyst yields a current density of at least 100 $mA/cm^2$ at an overpotential of less than or equal to about 225 mV for the OER, exhibits durability for at least 5,000 cycles, is operable for at least 20 hours at 100 $mA/cm^2$, or a combination thereof.

While preferred embodiments of the invention have been shown and described, modifications thereof can be made by one skilled in the art without departing from the teachings of this disclosure. The embodiments described herein are exemplary only, and are not intended to be limiting. Many variations and modifications of the invention disclosed herein are possible and are within the scope of the invention.

Numerous other modifications, equivalents, and alternatives, will become apparent to those skilled in the art once the above disclosure is fully appreciated. It is intended that the following claims be interpreted to embrace all such modifications, equivalents, and alternatives where applicable. Accordingly, the scope of protection is not limited by the description set out above but is only limited by the claims which follow, that scope including all equivalents of the subject matter of the claims. Each and every claim is incorporated into the specification as an embodiment of the present invention. Thus, the claims are a further description and are an addition to the detailed description of the present invention. The disclosures of all patents, patent applications, and publications cited herein are hereby incorporated by reference. Unless expressly stated otherwise, the steps in a method claim may be performed in any order and with any suitable combination of materials and processing conditions.

What is claimed is:

1. A method of manufacturing a bifunctional electrocatalyst for overall water splitting comprising oxygen evolution reaction (OER) and hydrogen evolution reaction (HER), the method comprising:
   growing electrocatalyst comprising primarily metallic phosphides on a three-dimensional substrate comprising a metallic foam by:
   immersing the substrate in an iron nitrate solution to form a once disposed substrate;
   subjecting the once disposed substrate to thermal phosphidation with phosphorus powder under inert gas to grow metal phosphides thereupon and form a once subjected substrate;
   cooling the once subjected substrate to form a cooled, once subjected substrate;
   immersing the cooled, once subjected substrate in an iron nitrate solution to form a twice disposed substrate; and
   subjecting the twice disposed substrate to thermal phosphidation with phosphorus powder under inert gas to provide an electrode comprising the bifunctional electrocatalyst on the three-dimensional substrate,
   wherein the metallic phosphides comprise iron phosphide (FeP) and dinickel phosphide ($Ni_2P$).

2. The method of claim 1, wherein the metallic phosphides comprise a majority of iron phosphide (FeP) and a minority of dinickel phosphide ($Ni_2P$).

3. The method of claim 2, wherein the metallic phosphides comprise less than or equal to about 20 weight percent dinickel phosphide ($Ni_2P$) and greater than or equal to about 80 weight percent iron phosphide (FeP).

4. The method of claim 1, wherein thermal phosphidation is effected at a temperature in the range of from about 350° C. to about 550° C.

5. The method of claim 1, wherein subjecting the once disposed substrate to thermal phosphidation, subjecting the twice disposed substrate to thermal phosphidation, or both comprises a thermal phosphidation for a duration of time in the range of from about 0.5 hour to about 1 hour.

6. The method of claim 1, wherein the three-dimensional substrate comprises nickel (Ni) foam, wherein the metallic phosphides of the bifunctional electrocatalyst comprise FeP and $Ni_2P$, and wherein the electrode consists essentially of an FeP/$Ni_2P$/Ni foam.

7. The method of claim 1, wherein the metallic foam comprises nickel (Ni), copper (Cu), iron (Fe), cobalt (Co), titanium (Ti), or a combination thereof.

8. The method of claim 1, wherein the inert gas comprises argon, and wherein the phosphorus comprises red phosphorus.

9. The method of claim 1, wherein subjecting to thermal phosphidation comprises direct thermal phosphidation in a tube furnace or a chemical vapor deposition (CVD) system or molecular organic chemical vapor deposition (MOCVD) system under argon atmosphere.

10. The method of claim 1, wherein the electrocatalyst has a porosity greater than or equal to a porosity of the substrate.

11. The method of claim 1, wherein the electrocatalyst is operable for alkaline water electrolysis.

12. The method of claim 1, wherein the bifunctional electrocatalyst exhibits performance for both the HER and the OER, and is stable at current densities of up to at least 100 mA/cm$^2$.

13. The method of claim 1, wherein the metallic foam comprises nickel (Ni) foam, wherein the metallic phosphides consist essentially of the iron phosphide (FeP) and the dinickel phosphide (Ni$_2$P), and wherein the electrode consists essentially of FeP and Ni$_2$P on Ni foam, and wherein, when operated in 1M alkaline solution, the bifunctional electrocatalyst requires a low overpotential of less than 15 mV and 155 mV, respectively, to deliver a current density of 10 mA/cm$^2$ for the HER and OER, leading to an overall water-splitting activity at 10 mA/cm$^2$ with less than 1.5 V.

* * * * *